United States Patent
Schmaelzle et al.

(10) Patent No.: US 9,729,101 B1
(45) Date of Patent: Aug. 8, 2017

(54) DEPLOYMENT TECHNIQUES OF A FLOATING PHOTOVOLTAIC POWER GENERATION SYSTEM

(71) Applicant: Google Inc., Mountain View, CA (US)

(72) Inventors: Philipp H. Schmaelzle, Mountain View, CA (US); Dominico Julian, Oakland, CA (US); Leo F. Casey, San Francisco, CA (US); Mark Greise, Santa Ynez, CA (US); Robert Baikie, San Francisco, CA (US); Thomas P. Hunt, Oakland, CA (US); Todd A. Pelman, Moss Beach, CA (US); Garrison J. Buchanan, Woodside, CA (US); Raphael J. Feldman, Mountain View, CA (US); William J. Shields, San Francisco, CA (US); Justin S. Hyde, San Francisco, CA (US)

(73) Assignee: X Development LLC, Mountain View, CA (US)

( * ) Notice: Subject to any disclaimer, the term of this patent is extended or adjusted under 35 U.S.C. 154(b) by 0 days.

(21) Appl. No.: 15/218,882

(22) Filed: Jul. 25, 2016

Related U.S. Application Data

(60) Provisional application No. 62/327,172, filed on Apr. 25, 2016.

(51) Int. Cl.
  *B63B 35/44* (2006.01)
  *H02S 20/30* (2014.01)
  (Continued)

(52) U.S. Cl.
  CPC .............. *H02S 20/30* (2014.12); *B63B 22/04* (2013.01); *H02S 20/10* (2014.12); *B63B 2035/4453* (2013.01)

(58) Field of Classification Search
  CPC .......... B63B 22/04; B63B 35/00; B63B 35/58; B63B 2035/00; B63B 2035/4433; B63B 2035/4453; H02S 20/10; H02S 20/30
  (Continued)

(56) References Cited

U.S. PATENT DOCUMENTS

| 5,391,235 A | 2/1995 | Inoue |
| 8,511,006 B2 | 8/2013 | Reisdorf et al. |

(Continued)

FOREIGN PATENT DOCUMENTS

| CN | 204216820 U | 3/2015 |
| CN | 105048958 A | 11/2015 |

(Continued)

OTHER PUBLICATIONS

CIGS PV Modules—Renovagen Ltd., accessed Mar. 21, 2016, 2 pages.

(Continued)

*Primary Examiner* — Daniel V Venne
(74) *Attorney, Agent, or Firm* — Christensen O'Connor Johnson Kindness PLLC

(57) ABSTRACT

A method of deploying floating photovoltaic ("PV") modules on water includes attaching first and second sections of a tensioning frame between a first group of mooring buoys. In a first embodiment, the first and second sections are adjoining sections attached to a common one of the mooring buoys and a plurality of PV modules are unrolled from positions adjacent to the first section of the tensioning frame and the PV modules are extended out from the first section. In a second embodiment, the PV modules are unrolled and extended out between two floating platforms. The PV modules are mechanically attached into a contiguous PV array. Third and fourth sections of the tensioning frame are attached between a second group of the mooring buoys to at (Continued)

least partially surround the PV array with the tensioning frame. Tension on the tensioning frame is adjusted to place the PV array under tension.

25 Claims, 17 Drawing Sheets

(51) Int. Cl.
    *H02S 20/10*     (2014.01)
    *B63B 22/04*     (2006.01)

(58) Field of Classification Search
    USPC .......... 114/230.1, 230.2, 264, 265, 266, 267, 114/293; 441/1, 35, 136; 136/251
    See application file for complete search history.

(56) References Cited

U.S. PATENT DOCUMENTS

| | | | |
|---|---|---|---|
| 8,887,654 | B2 | 11/2014 | Hoefler |
| 9,085,346 | B2 | 7/2015 | Woo |
| 2005/0257827 | A1 | 11/2005 | Gaudiana et al. |
| 2008/0029148 | A1 | 2/2008 | Thompson |
| 2014/0174508 | A1 | 6/2014 | Sznerski et al. |
| 2015/0007872 | A1* | 1/2015 | Cap ................... E04D 11/005 136/251 |
| 2015/0130281 | A1 | 5/2015 | Sabripour |
| 2015/0357821 | A1 | 12/2015 | Grana |
| 2016/0134228 | A1* | 5/2016 | Sun .................... H02S 20/10 136/251 |
| 2016/0156304 | A1 | 6/2016 | Smadja et al. |

FOREIGN PATENT DOCUMENTS

| | | |
|---|---|---|
| EP | 2697574 | 2/2014 |
| FR | 2935410 | 3/2010 |
| FR | 2952092 | 5/2011 |
| FR | 2968267 | 6/2012 |
| FR | 2968386 | 6/2012 |
| FR | 2980562 | 3/2013 |
| FR | 2993855 | 1/2014 |
| JP | 4476071 B2 | 6/2010 |
| KR | 101160798 B1 | 6/2012 |
| WO | WO2013153329 | 10/2013 |

OTHER PUBLICATIONS

Flexible Pre-wired PV Array Structure—Renovagen Ltd., accessed Mar. 21, 2016, 2 pages.
Global Performance Modelling—Renovagen Ltd., accessed Mar. 21, 2016, 3 pages.
Hydrelio© Floating Solar System, Simple, Durable and Affordable Floating Solar PV Platforms—Ciel & Terre, accessed May 10, 2016, 3 pages.
Hydrelio© Floating Solar System, Hydrelio© Components—Ciel & Terre, accessed May 10, 2016, 4 pages.
Liquid Solar Array—Sunengy, accessed May 10, 2016, 2 pages.
Rollarray Isogen Transportable Solar Power Plant—Renovagen Ltd., accessed Mar. 21, 2016, 2 pages.
Rollarray Multigen Ultimate Global Mobility—Renovagen Ltd., accessed Mar. 21, 2016, 5 pages.
Rollarray Roll-Deployed PV Array—Renovagen Ltd., accessed Mar. 21, 2016, 5 pages.
Leveraging Water Surfaces to Generate Solar Energy—Solaris Synergy, accessed May 10, 2016, 3 pages.
Trapani et al., A review of floating photovoltaic installations: 2007-2013, Progress in Photovoltaics: Research and Applications, 2014, 9 pages.
Solar Laminate PVL-Series—Uni-Solar, 2009, 2 pages.
Spectro PowerCap™—Carlisle Energy Services, Feb. 3, 2011, 23 pages.
Solar on the Water—New York Times, Apr. 19, 2011, 10 pages.
Floatovoltaics! Far Niente Winery's Floating Solar Power—Inhabitat, accessed Jun. 15, 2016, 2 pages.
U.S. Appl. No. 15/218,872—Floating Photovoltaic Power Generation System, filed Jul. 25, 2016, 61 pages.

* cited by examiner

US 9,729,101 B1

DEPLOYMENT TECHNIQUES OF A FLOATING PHOTOVOLTAIC POWER GENERATION SYSTEM

REFERENCE TO RELATED APPLICATIONS

This application claims the benefit of U.S. Provisional Application No. 62/327,172 filed on Apr. 25, 2016, the contents of which are incorporated herein by reference. The present application is related to a U.S. Application entitled "Floating Photovoltaic Power Generation System," U.S. patent application Ser. No. 15/218,872, filed on Jul. 25, 2016.

TECHNICAL FIELD

This disclosure relates generally to solar power generation, and in particular, relates to floating solar power generation.

BACKGROUND INFORMATION

As societies continue to industrialize throughout the world, the demand for affordable and plentiful electricity continues to grow. Renewable sources of electricity are increasingly being relied upon to meet this ever growing demand. One popular renewable source of electricity is solar power generation.

The construction of solar power plants is expensive and labor intensive. Each solar power module must be mechanically supported and electrically connected. Additionally, solar power plants may consume acres of otherwise usable land. A solar power module that can be economically fabricated, that is quickly, efficiently, and safely deployable in areas that are otherwise not being used, would be desirable and likely increase the adoption rate of commercial scale solar power generation.

BRIEF DESCRIPTION OF THE DRAWINGS

Non-limiting and non-exhaustive embodiments of the invention are described with reference to the following figures, wherein like reference numerals refer to like parts throughout the various views unless otherwise specified. Not all instances of an element are necessarily labeled so as not to clutter the drawings where appropriate. The drawings are not necessarily to scale, emphasis instead being placed upon illustrating the principles being described.

DETAILED DESCRIPTION

Embodiments of an apparatus, system and method of deployment for a floating photovoltaic ("PV") power generation system are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
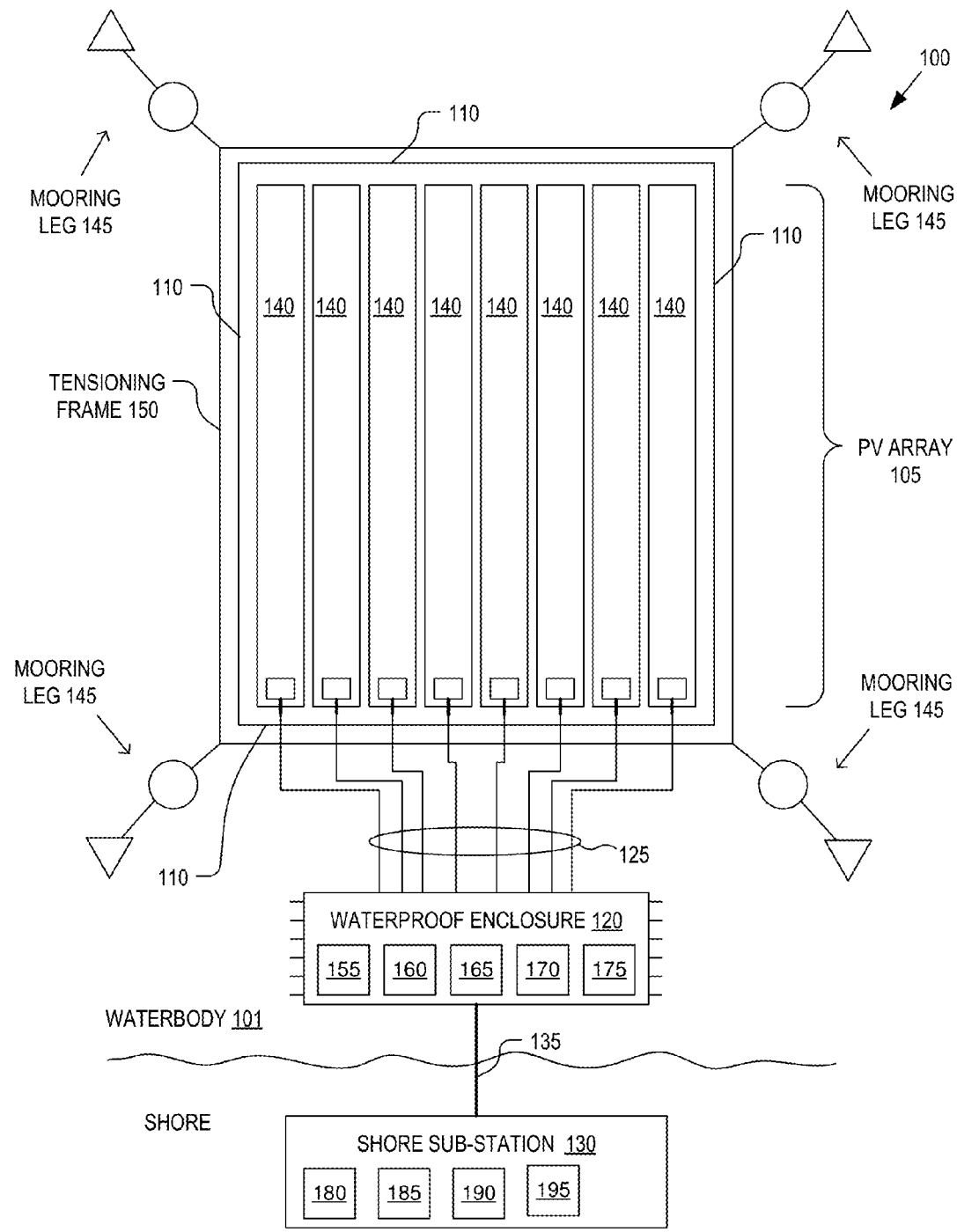
FIG. 1 is a block diagram illustrating components of a floating photovoltaic ("PV") power generation system, in accordance with an embodiment of the disclosure.

FIG. 1 is a block diagram illustrating components of a floating PV power generation system 100, in accordance with an embodiment of the disclosure. The illustrated embodiment of PV power generation system 100 includes a PV array 105, edge protection members 110, a mooring assembly, a waterproof enclosure 120, an electrical interconnect assembly 125, a shore substation 130, and a shore power cable 135. The illustrated embodiment of PV array 105 includes PV modules 140. The illustrated embodiment of the mooring assembly includes mooring legs 145 and tensioning frame 150. The illustrated embodiment of waterproof enclosure 120 houses a power combiner 155, a controller 160, a monitoring system 165, and communication adapters 170 and 175. The illustrated embodiment of shore substation 130 includes a power converter 180, a controller 185, a monitoring system 190, and a communication adapter 195.

PV power generation system 100 is a solar power generation system that floats on waterbodies, such as reservoirs, lakes, or even protected coastal waters, though reservoirs may be the most suitable locations for a variety of reasons. For instance, reservoirs are typically shallow protected waterbodies. Floating solar power generation can compare favorably to land-based solar power generation systems because the surface of reservoirs often represents unused space that is not amenable to other productive purposes. In contrast, land-based solar power generation systems often compete with other productive land uses, such as agriculture. Inherent attributes of a water based deployment can be leveraged for effective cooling that increases operational efficiency, extends expected service lifespans, and otherwise increases a return on investment ("ROI") for a commercial-scale power generation system. Additionally, floating solar power systems, such as PV power generation system 100, reduces water evaporation, which is an important benefit for many reservoirs.

During operation, PV power generation system 100 is moored in a waterbody 101 and coupled to deliver solar power to shore substation 130 disposed on a shore of waterbody 101. Shore substation 130 may be coupled to deliver the solar power to a power grid or directly coupled to a local community or nearby facility (e.g., factory). PV array 105 includes a number of PV modules 140 mechanically bound together to form a contiguous block of PV modules 140. While PV power generation system 100 can be deployed with a variable number of PV modules 140, which may each have a variety of different sizes, in one embodiment, each PV module 140 is 100 m long by 2 m wide and outputs 20 kW. In one embodiment, 50 PV modules 140 are connected to form a square contiguous PV array 105 having an overall power generation of 1 MW. Of course, PV arrays 105 having larger or smaller individual PV modules 140 and/or having a greater or smaller number of connected PV modules 140 may be implemented. FIG. 1 illustrates just eight PV modules 140 included within PV array 105 for simplicity of illustration.

Each PV module 140 includes solar cells connected in series in one or more solar cell strings to generate solar power. The solar cells are embedded within a laminated structure forming a sort of floating solar mat, which is compliant to folding or bending in response to wave action on a surface of waterbody 101. Since PV modules 140 use their buoyancy to float on or near the surface of waterbody 101, extensive (and often expensive) support housings and infrastructure that typify land based solar power systems are not necessary. By floating PV modules 140 on or near the surface of waterbody 101, PV modules 140 intimately contact the water for inherent heat dissipation and thermal cooling.

In the illustrated embodiment, PV array 105 is held in place by the mooring assembly, which includes mooring legs 145 and tension frame 150. Tension frame 150 maintains tension on PV array 105 to ensure the individual PV modules 140 do not tangle or otherwise experience compression that could damage PV modules 140. Tension frame 150 is tethered to mooring legs 145 so that the overall PV array 105 maintains a desired location within waterbody 101. Mooring legs 145 may be anchored to a bottom of the waterbody using various types of anchors (e.g., gravity anchor, embedment anchor, etc.).

The illustrated embodiment of PV power generation system 100 further includes edge protection members 110 that extend around multiple sides (e.g., all sides in the embodiment of FIG. 1) of PV array 105 to protect PV modules 140 from floating debris in waterbody 101. In the illustrated, edge protection members 110 are disposed between tension frame 150 and PV array 105 and also serve as a mechanical intermediary between tension frame 150 and PV array 105. In one embodiment, edge protection members 110 further serve as a wind block to prevent wind from getting under the edges of PV array 105 and lifting PV array 105 off the surface of the waterbody in high wind storms.

PV modules 140 are electrically coupled to the functional units housed within waterproof enclosure 120 via electrical interconnect assembly 125. In one embodiment, electrical interconnection assembly 125 is a waterproof wiring harness having individual power leads of variable length that match the variable distances between waterproof enclosure 120 and the connection points on PV modules 140. A single wiring harness allows for a quick and organized deployment in the field. In various embodiments, the connection points on PV modules 140 may include pigtail connections or socket connections mounted to a junction box integrated into one end of PV modules 140.

Waterproof enclosure 120 houses power combiner 155, controller 160, monitoring system 165, and communication adapters 170 and 175. Waterproof enclosure 120 is placed in the waterbody and provides environmental protection to these internal components and in particular provides thermal heat dissipation to the surrounding water for the power electronics of power combiner 155. In one embodiment, waterproof enclosure is a metal enclosure (e.g., aluminum) that dissipates heat via convection to the surrounding water. To promote heat transfer via convection, waterproof enclosure 120 may include vertical fins on the sides of the enclosure that encourage vertical water movement through/pass the fins to promote convective cooling.

Power combiner 155 operates to combine the solar power generated by PV modules 140 to which it is connected. In one embodiment, power combiner 155 connects to all PV modules 140 in PV array 105. In other embodiments, a separate power combiner 155 is allocated to each group of PV modules 140 (e.g., ten PV modules 140 per group) within a single PV array 105 and the outputs of the multiple power combiners are subsequently combined (discussed in greater detail in connection with FIG. 3 below).

In one embodiment, power combiner 155 is implemented with a DC-to-DC power converter that steps up the voltage output from PV modules 140. For example, each PV module 140 may output a direct current ("DC") voltage of 1 kV, while the power combiner 155 steps up the voltage to 3 kV or greater for transport over shore power cable 135 to shore substation 130. In various embodiments, the stepped up voltage may range from 3 kV to 21 kV on the water for power transport over shore power cable 135. In yet other embodiments, power combiner 155 is implemented with a DC-to-AC power inverter that converts the DC voltage output from PV modules 140 to an AC voltage for transport to shore substation 130 over shore power cable 135. In some embodiments, the DC-to-AC power conversion may also step up the voltage for increased transport efficiency over the potentially longer shore power cable 135. An example AC power signal for transport over shore power cable 135 is three phase AC, which may include four conductors within shore power cable 135 (three power conductors and a neutral/ground conductor). However, due to capacitive and inductive loss between the conductor and the water surrounding shore power cable 135, a DC voltage may provide increased transport efficiency. An example shore power cable 135 for transporting a DC power signal may include three conductors (a positive conductor, a negative conductor, and a ground conductor). In various other embodiments (not illustrated) the function of power conversion may be separated from power combiner 155 and housed in a separate waterproof enclosure for each PV module 140, or even integrated on-board each PV module 140. Power conversion may include one or both of a voltage step up and DC-to-AC inversion.

Monitoring system 165 is included within waterproof enclosure 120 to monitor electrical interconnect assembly 125 and shore power cable 135 for upstream and/or downstream fault conditions and other operational signals (e.g., power up or power down signals). In one embodiment, monitoring system 165 includes an impedance monitor (e.g., ohm meter) that monitors the impedances on the various conductors of electrical interconnect assembly 125 and shore power cable 135. If the impedances are determined to be outside of expected operational ranges, then a fault may be determined and controller 160 sends shut downs signals both upstream to PV array 105 and downstream to shore substation 130. For example, low impedances may be indicative of an insulation fault (e.g., cable breach) while high impedances may be indicative of an open circuit (e.g., severed cable). Monitoring system 165 may also include voltage and current monitors to monitor operational conditions of PV array 105. For example, a high voltage but low current condition may be indicative of nightfall, in which case controller 165 may place its connected PV modules 140 into a safe sleep state. Monitoring system 190 and controller 185 within shore substation 130 may also perform similar monitoring and control functions over shore power cable 135.

Communication adapters 170, 175, and 195 provide data communications between shore substation 130 and PV modules 140. In one embodiment, shore substation 130 communicates with the components in waterproof enclosure 120 using optical communication protocols over an optical fiber bundled with shore power cable 135 while the components of waterproof enclosure 120 communicate with PV modules 140 using power line communication protocols over electrical interconnect assembly 125. Accordingly, in this embodiment, communication adapters 170 and 195 are optical fiber communication adapters coupled to either ends of an optical fiber in shore power cable 135 while communication adapter 175 is a power line communication adaptor coupled to electrical interconnect assembly 125. Optical communications over shore power cable 135 enables longer runs between shore substation 130 and waterproof enclosure 120 while power line communications over electrical interconnect 125 simplifies the wiring harness and reduces the number of cable connections between waterproof enclosure 120 and PV array 105.

As mentioned above, shore substation 130 includes power converter 180. Power converter 180 serves to step up the voltage of the power signal received over shore power cable 135 to a grid-level voltage. In embodiments where the power signal output from power combiner 155 within waterproof enclosure 120 is a DC voltage, power converter 180 is an inverter that also converts the DC voltage to an AC voltage. Power converter 180 also isolates the grid from any fault in PV power generation system 100.

Controller 160 choreographs the operation of the other functional elements within waterproof enclosure 120 while controller 185 choreographs the operation of the other functional elements within shore substation 130. Controllers 160 and 185 may be implemented as hardware logic (e.g., application specific integrated circuit, field programmable gate array, etc.), software or firmware instructions executing on a microcontroller, or a combination of both.

Figure 2:
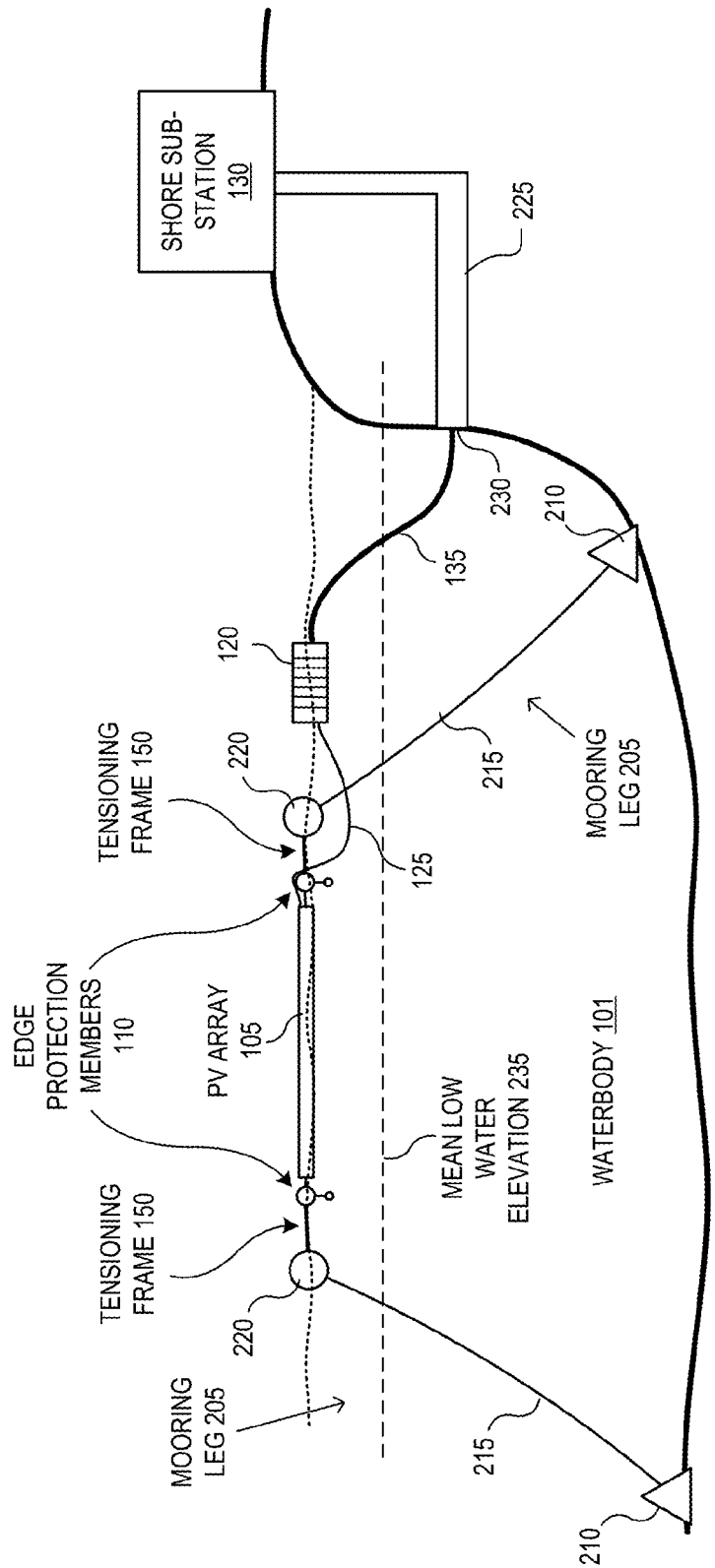
FIG. 2 is a profile illustration of the floating PV power generation system including a shore power cable connection to a shore substation, in accordance with an embodiment of the disclosure.

FIG. 2 is a profile illustration of a floating PV power generation system 200, in accordance with an embodiment of the disclosure. PV power generation system 200 is one possible implementation of PV power generation system 100. As illustrated, mooring legs 205 anchor PV array 105 in place within waterbody 101. The illustrated embodiment of mooring legs 205 each include an anchor 210, an anchor line (rode) 215, and a mooring buoy 220. It is worth repeating that the components in FIG. 2 (or any of the other drawings) are not illustrated to scale.

In the illustrated embodiment, shore power cable 135 extends along an underground path 225 (e.g., conduit) from shore substation 130 to an entry point 230 where it exits underground path 225 and enters waterbody 101. In one embodiment, entry point 230 is positioned below a mean low water elevation 235 of waterbody 101. Providing a year around underwater entry point increases safety by reducing the likelihood people, wildlife, or vehicles in the vicinity of the shoreline will directly encounter shore power cable 135, which carries high voltage power. Shore power cable 135 may also be routed along or under various shoreline structures, such as docks.

Figure 3:
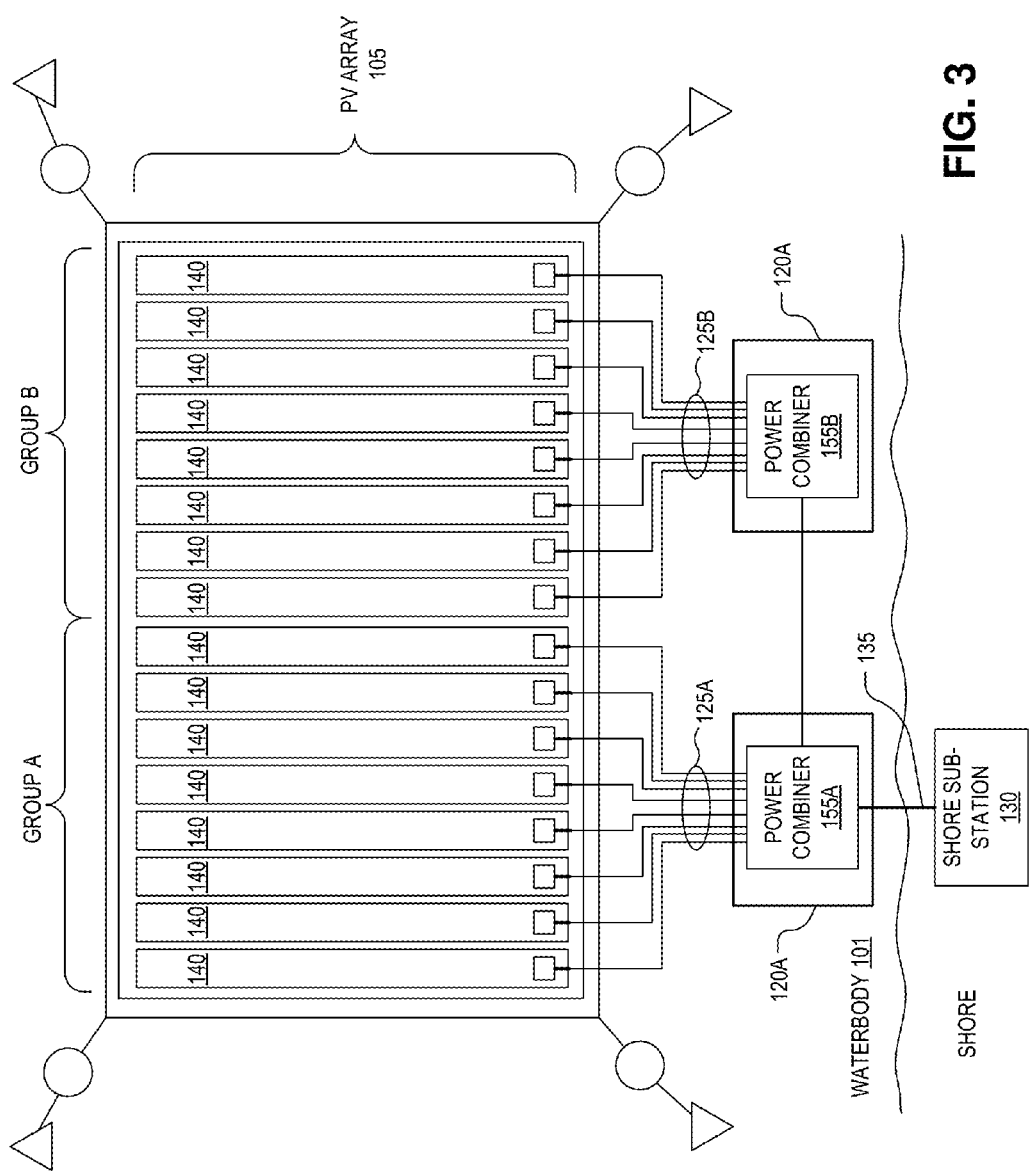
FIG. 3 is a block diagram illustrating electrical connections to a PV array using multiple power combiners, in accordance with an embodiment of the disclosure.

FIG. 3 is a block diagram illustrating how the solar power of PV modules 140 of a single PV array 105 may be combined using multiple power combiners 155A and 155B (collectively power combiners 155), in accordance with an embodiment of the disclosure. As illustrated, each power combiner 155 is coupled to a different subset or group of PV modules 140 via a separate electrical interconnect assembly 125.

As illustrated, power combiner 155A is coupled to collect and combine the solar power generated by PV modules 140 of group A while power combiner 155B is coupled to collect and combine the solar power generated by PV modules 140 of group B. Power combiner 155B is coupled to relay its collected solar power to power combiner 155A while only power combiner 155A is directly coupled to shore substation 130 via shore power cable 135. Accordingly, power combiners 155 are coupled in series to relay and combine the solar power collected from their respective group for common transmission to shore substation 130 over shore power cable 135. Although FIG. 3 illustrates just two power combiners 155 each coupled to eight PV modules 140, it should be appreciated that in practice more than two power combiners 155 may be coupled in series and each power combiner 155 may be coupled to combine the solar power of more or less PV modules 140. For example, PV array 105 may include 50 PV modules 140 organized into five groups such that each power combiner 155 combines the solar power output from ten PV modules 140.

Reducing the number of PV modules 140 directly coupled in parallel via a single power combiner 155, increases the operational efficiency of PV modules 140. This is because the PV module 140 outputting the lowest voltage of a given group can reduce the efficiency of the other directly coupled PV modules 140 within the same group. In one embodiment, power combiners 155 operate to regulate their output voltages (e.g., step up to a common output voltage such as 3 kV), which reduces inefficient power coupling when combining solar power relayed between power combiners 155.

Figure 4:
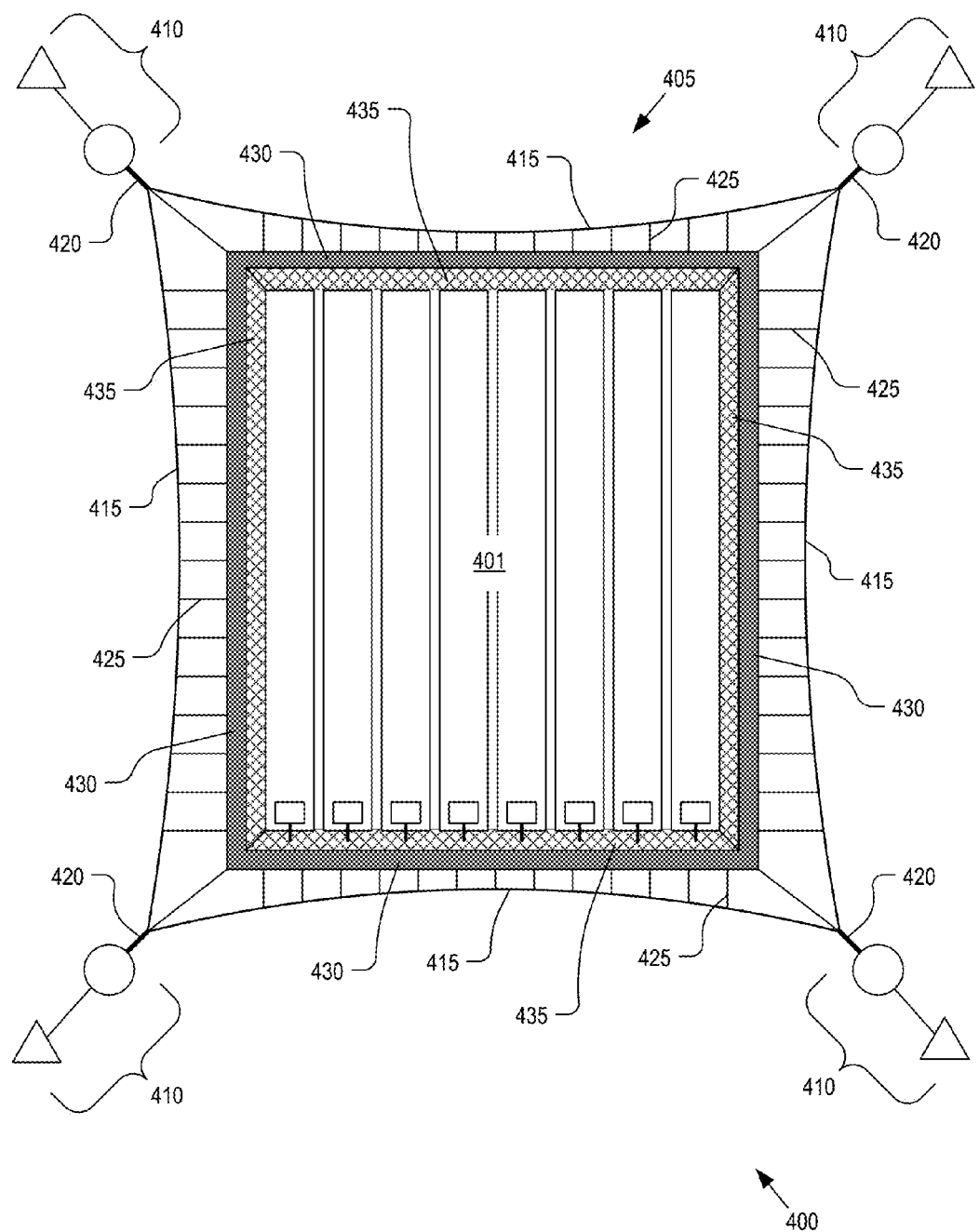
FIG. 4 illustrates details of a mooring assembly and edge protection members of the floating PV power generation system, in accordance with an embodiment of the disclosure.

FIG. 4 illustrates details of a mooring assembly and edge protection members of a floating PV power generation system 400, in accordance with an embodiment of the disclosure. PV power generation system 400 is one possible implementation of PV power generation system 100; however, certain components (e.g., waterproof enclosure, electrical interconnect assembly, shore power cable, shore substation, etc.) have been omitted from FIG. 4 so as not to clutter the drawing. The illustrated embodiment of the mooring assembly includes a tensioning frame 405 and mooring legs 410. The illustrated embodiment of tensioning frame 405 includes main lines 415, adjustable tensioning tethers 420, and boom ties 425. The illustrated embodiment of the edge protection members includes floating boom sections 430 and boom-to-array connectors 435.

Tensioning frame 405 serves as a connection between mooring legs 410 and PV array 401. Tensioning frame 405 maintains tension on the PV modules of PV array 401 to prevent them from experiencing compression that damages the PV modules or twisting on themselves. In the illustrated embodiment, tensioning frame 405 physically connects to floating boom sections 430 while boom-to-array connectors 435 translate the tensile force to PV array 401. In other embodiments, tensioning frame 405 may couple directly to PV array 401. In one embodiment, floating boom sections 430 are disposed along the outside perimeter of main lines 415 (not illustrated).

Main lines 415 are mainlines extended between mooring legs 410. Main lines 415 form an arc between their connecting mooring legs 410, which maintains tension on boom ties 425. Boom ties 425 extend between the main lines 415 and floating boom sections 430 and serve to apply tensile forces around all sides of PV array 401. In one embodiment, tensioning frame 405 is formed as a rope rigging. For example, tensioning frame 405 may be fabricated of a low weight, stretch resistant, UV stable line. In one embodiment, tensioning frame 405 is a sheathed polymer line.

Figure 5A:
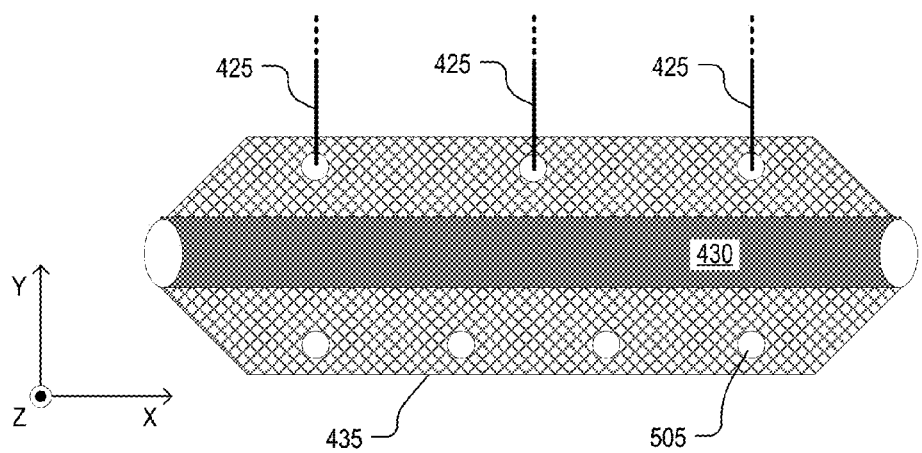
FIGS. 5A and 5B are plan and side view illustrations of an edge protection member, in accordance with an embodiment of the disclosure.

In the illustrated embodiment, boom ties 425 exerted a tensile force onto the outer sides of floating boom sections 430, which in turn translate the tensile force to PV array 401 via boom-to-array connectors 435. FIG. 5A illustrates an example implementation of floating boom sections 430 and boom-to-array connectors 435. In the illustrated embodiment of FIG. 5A, boom-to-array connector 435 is a fabric tab/flap with eyeholes 505 (e.g., grommets) that are lashed (or otherwise mechanically connected) to outer edges of those PV modules that fall along the perimeter of PV array 401. Other mechanical connections than eyeholes 505 may be used (e.g., straps, buckles, clips, snaps, hook and loop connectors, quick ties, zipper, etc.). In other embodiments, boom ties 425 may connect directly to the PV modules by passing through or over floating boom sections 430.

Returning to FIG. 4, adjustable tensioning tethers 420 provide a mechanism for adjusting the tension on tensioning frame 405 by adjusting their lengths. For example, each adjustable tensioning tether 420 may be implemented as a pulley assembly (e.g., block and tackle) with a lock, replaceable tethers of variable lengths, cinch-tight straps, or otherwise. Adjustable tensioning tethers 420 allow the system to be deployed and interconnected while tensioning frame 405 is relaxed, then subsequently pulled taut to a desired tensile force to ensure PV array 401 is appropriately held in place. If tensioning frame 405 stretches after the initial deployment or a wind or wave storm, adjustable tensioning tethers 420 can readily be retightened as needed.

Figure 5B:
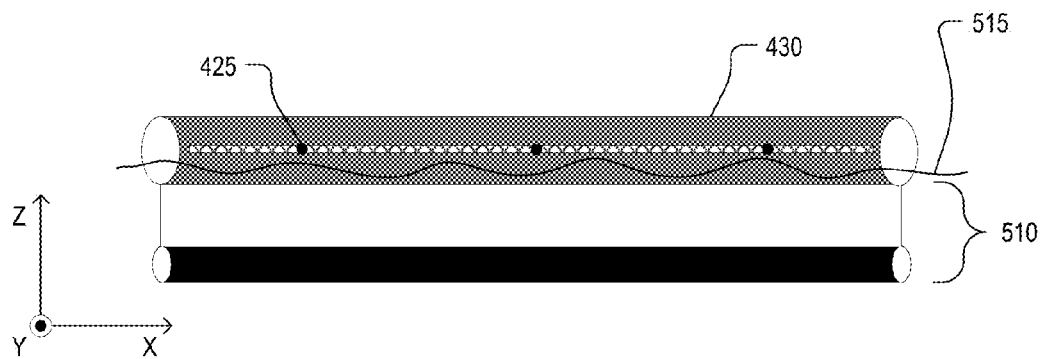

FIG. 5B illustrates a profile view of an edge protection member including a barrier 510 extending beneath floating boom section 430. The illustrated embodiment of barrier 510 is a sort of boom skirt that connects to the bottom side of floating boom section 430, extends below the waterline 515, and operates as a water surface windscreen to block wind from getting underneath PV array 401. Barrier 510 may be implemented using a variety of different structures having different shapes that extend below the surface of the water including a weighted curtain, a water filled curtain, or otherwise. Although FIGS. 5A and 5B illustrate floating boom 430 as having a circular cross-sectional shape, the term floating boom is defined broadly herein to include a variety of different cross-sectional shapes.

Figure 6:
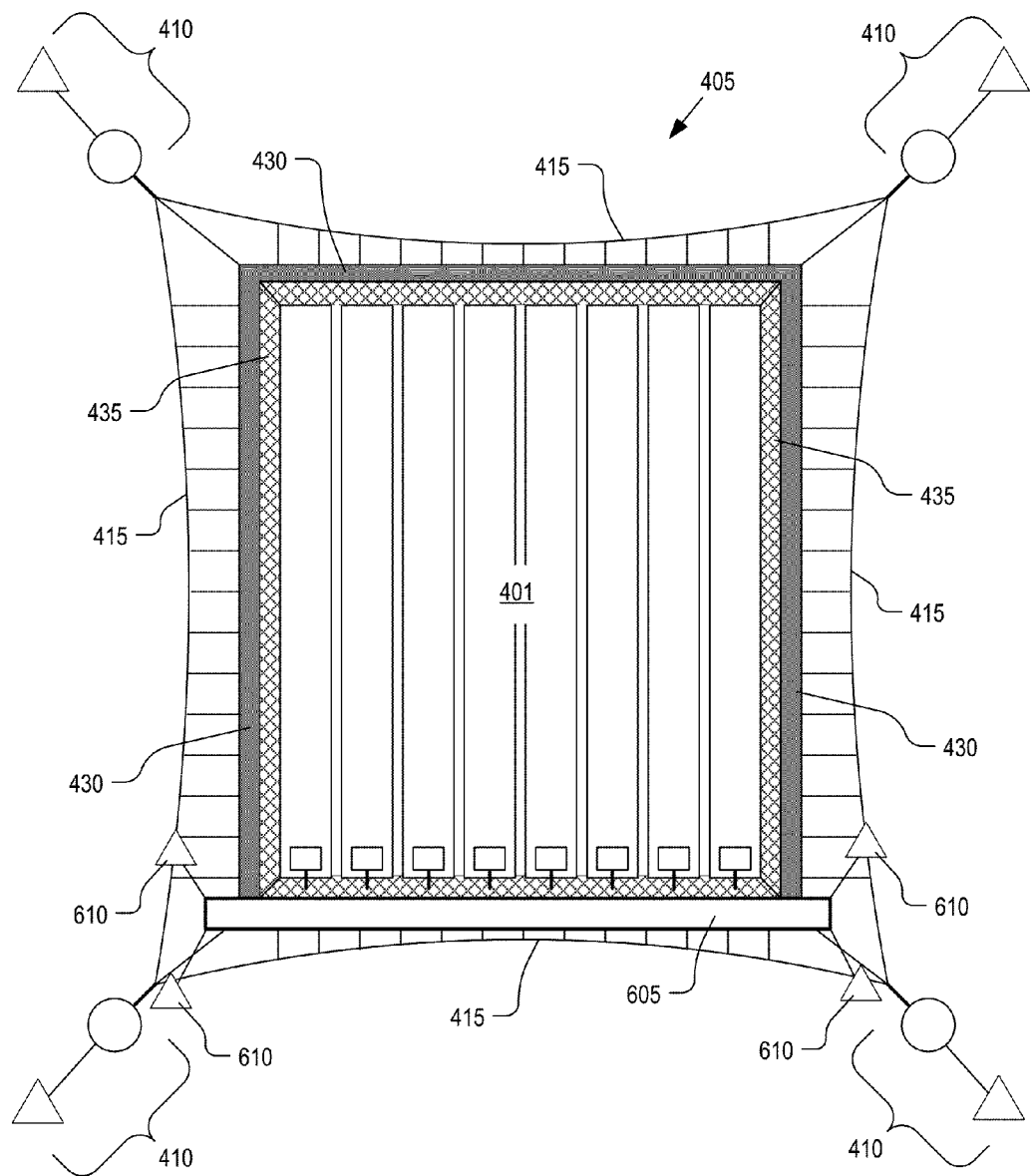
FIG. 6 illustrates a floating PV power generation system including a floating platform moored alongside the PV array, in accordance with an embodiment of the disclosure.

FIG. 6 illustrates a floating PV power generation system 600, in accordance with an embodiment of the disclosure. PV power generation system 600 is similar to PV power generation system 400 except for the addition of a floating platform 605 moored along one side of PV array 401. Floating platform 605 provides an on-water staging area for deployment and maintenance access to one side of PV array 401. Floating platform 605 may be implemented as a barge, wharf, pontoon, dock or other floating structure. In one embodiment, floating platform 605 is moored with independent anchors 610; however, in other embodiments, floating platform 605 may be coupled into the mooring assembly surrounding PV array 401. In the illustrated embodiment, floating platform 605 replaces one section of floating boom section 430; however, in other embodiments, floating platform 605 may be coupled between one side of tensioning frame 405 and one of the floating boom sections 430. In FIG. 6 floating platform 605 is approximately the length of one side of PV array 401; however, in other embodiments, floating platform 605 may be substantially shorter (e.g., 1/10 the length) and incrementally moved along the length of one side of PV array 401 during deployment of the PV modules.

Figure 7:
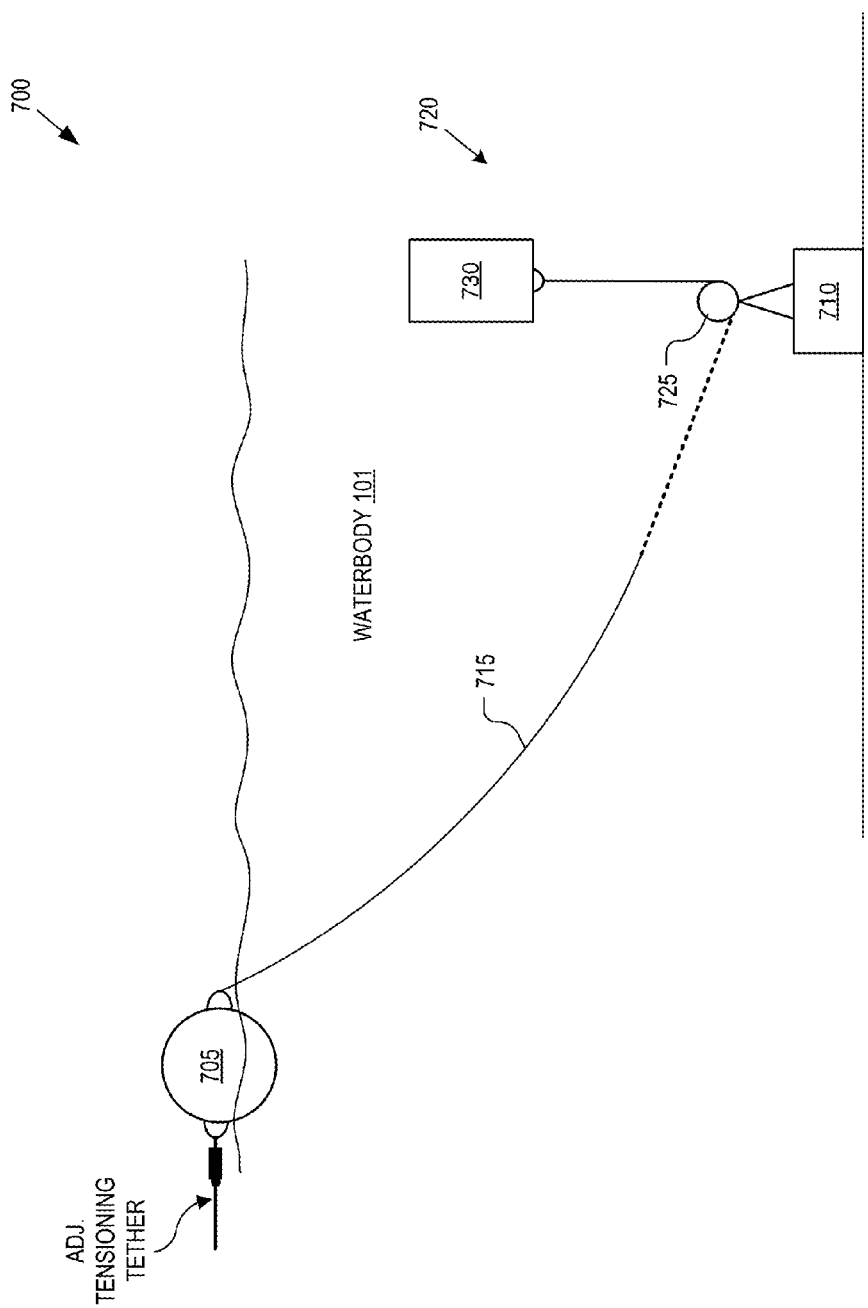
FIG. 7 illustrates a mooring leg including an anchor tensioner assembly, in accordance with an embodiment of the disclosure.

FIG. 7 illustrates a mooring leg 700, in accordance with an embodiment of the disclosure. Mooring leg 700 is one possible implementation of mooring leg 145 illustrated in FIG. 1. The illustrated embodiment of mooring leg 700 includes a mooring buoy 705, an anchor 710, an anchor line 715, and an anchor tensioner assembly 720. The illustrated embodiment of anchor tensioner assembly 720 includes a pulley 725 mounted to anchor 710 and a float 730 coupled to the opposite end of anchor line 715 as mooring buoy 705.

During operation, anchor tensioner assembly 720 maintains tension on anchor line 715 despite limited fluctuations in water elevations of waterbody 101. Maintaining tension on anchor line 715 ensures tensioning frame 150 can keep PV array 105 under tension. In the illustrated embodiment, float 730 maintains a constant buoyancy force on anchor line 715 so long as float 730 remains under water. In one embodiment, pulley 725 is pivot mounted to anchor 710 so it may rotate and allow anchor line 715 to extend in any direction. In this manner, the deployment of anchor 710 is not orientation dependent. As mentioned above, anchor 710 may be implemented using a variety of anchor types including gravity anchors, embedment anchors driven into the bottom of waterbody 101, or otherwise.

Figure 8:
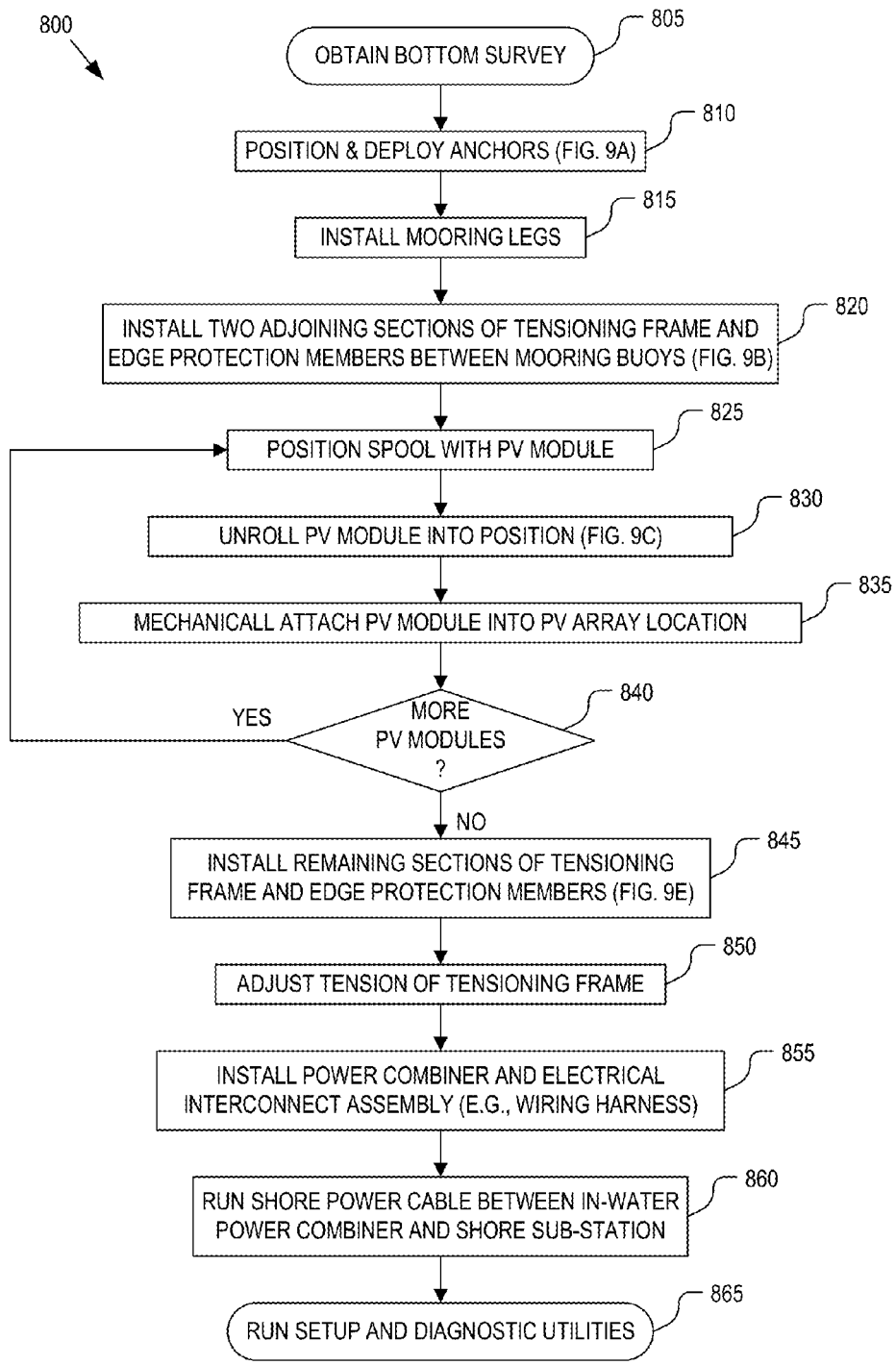
FIG. 8 is a flow chart illustrating a process of deploying a floating PV power generation system, in accordance with an embodiment of the disclosure.

FIG. 8 is a flow chart illustrating a process 800 of deploying floating PV power generation system 100, in accordance with an embodiment of the disclosure. Process 800 is described with reference to FIGS. 9A-F, which illustrate various stages of deployment. The order in which some or all of the process blocks appear in process 800 should not be deemed limiting. Rather, one of ordinary skill in the art having the benefit of the present disclosure will understand that some of the process blocks may be executed in a variety of orders not illustrated, or even in parallel.

Figure 9A:
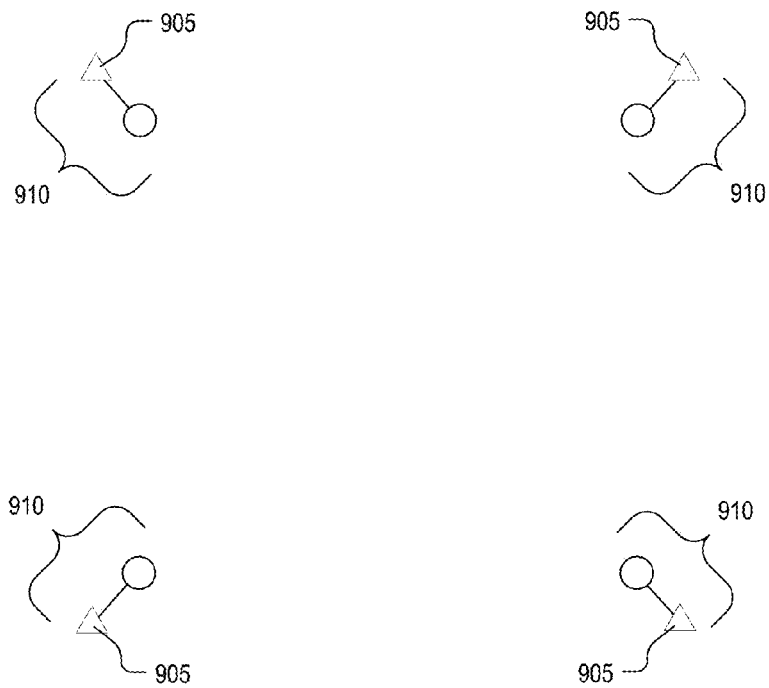
FIGS. 9A-G illustrate various stages of deployment for a floating PV power generation system, in accordance with embodiments of the disclosure.

In a process block 805, a bottom survey of waterbody 101 is obtained. The bottom survey may be retrieved from a database of previously recorded surveys or obtained on-site at the time of deployment. In one embodiment, the bottom survey includes depth readings in the vicinity of where anchors are to be deployed. In a process block 810, anchors are deployed in specified locations. Referring to FIG. 9A, four anchors 905 are deployed in a rectangular pattern. In other embodiments, more or less anchors 905 may be deployed in other patterns. In a process block 815, the remaining elements of the mooring legs 910 are installed and attached to anchors 905. In one embodiment, the remaining components of mooring legs 910 include at least attaching an anchor line and mooring buoy. In other embodiments, an anchor tensioner assembly is also deployed. Although the figures herein all illustrate round mooring buoys, it should be appreciated that the term mooring buoy is broadly defined herein to include a floating device having a variety of different shapes and sizes.

Figure 9B:
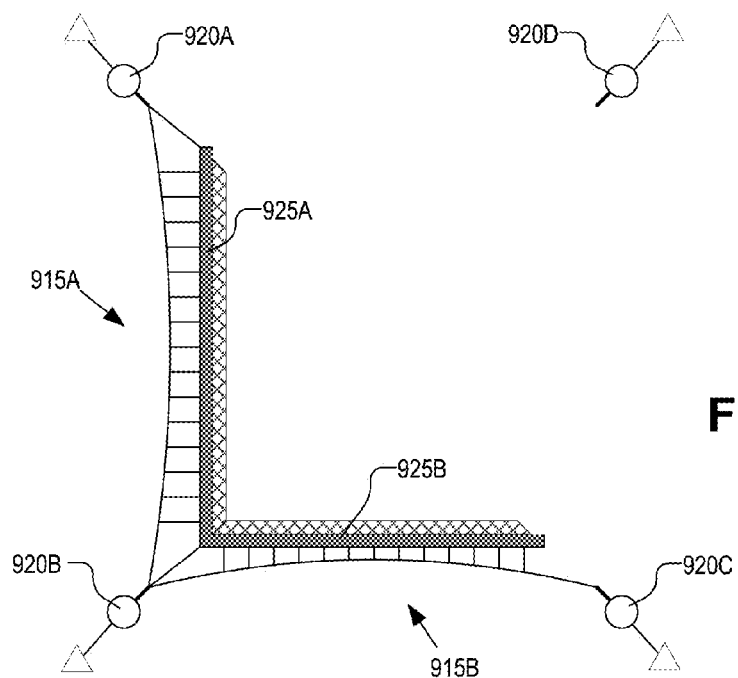
Figure 9C:
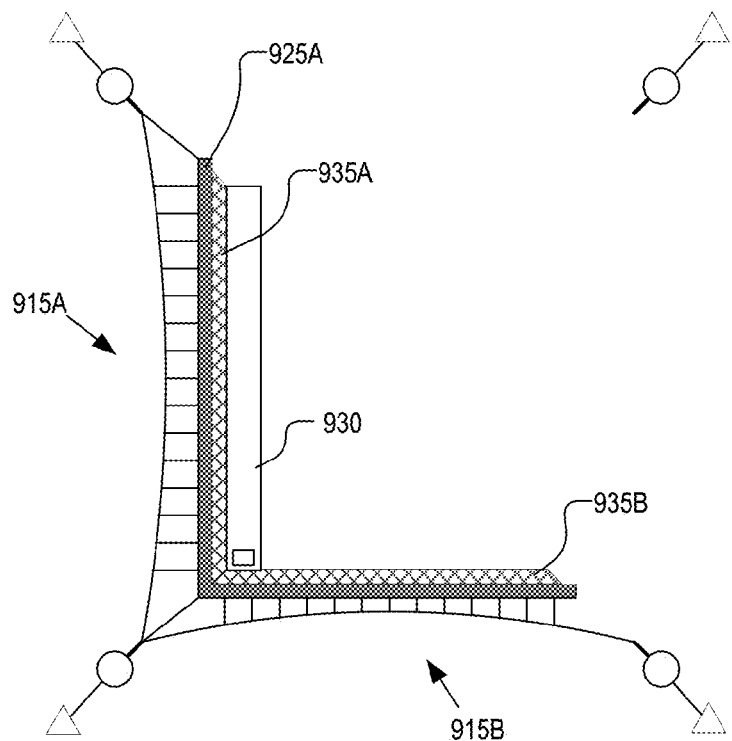
Figure 9D:
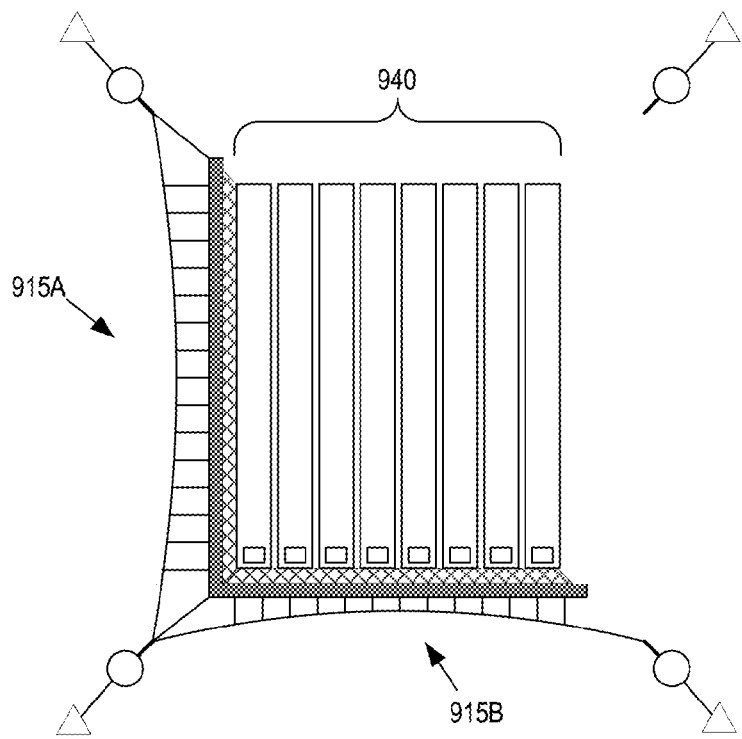
Figure 9E:
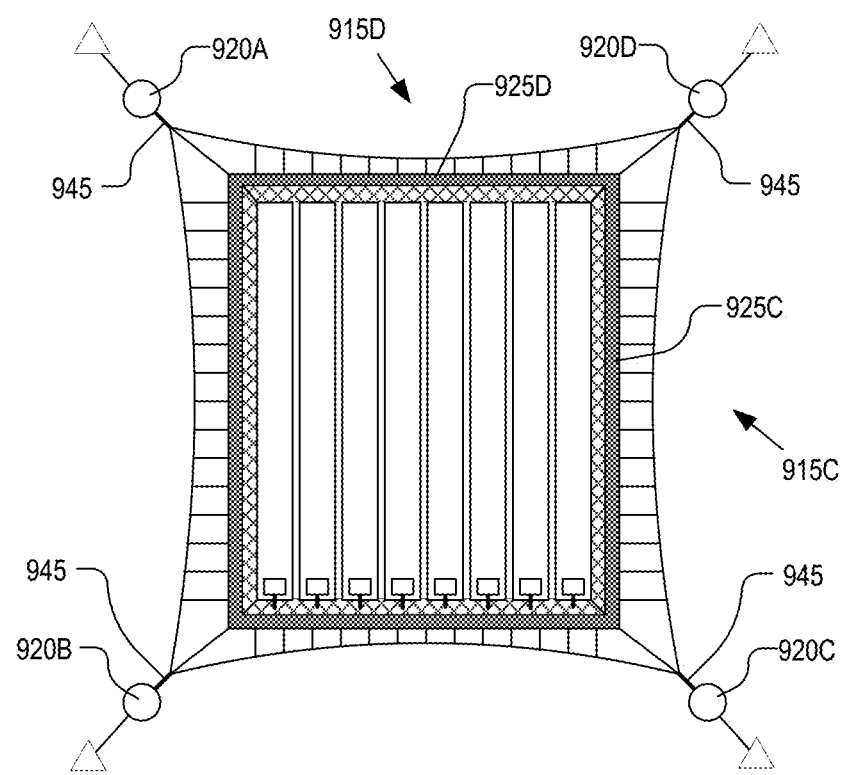
Figure 9F:
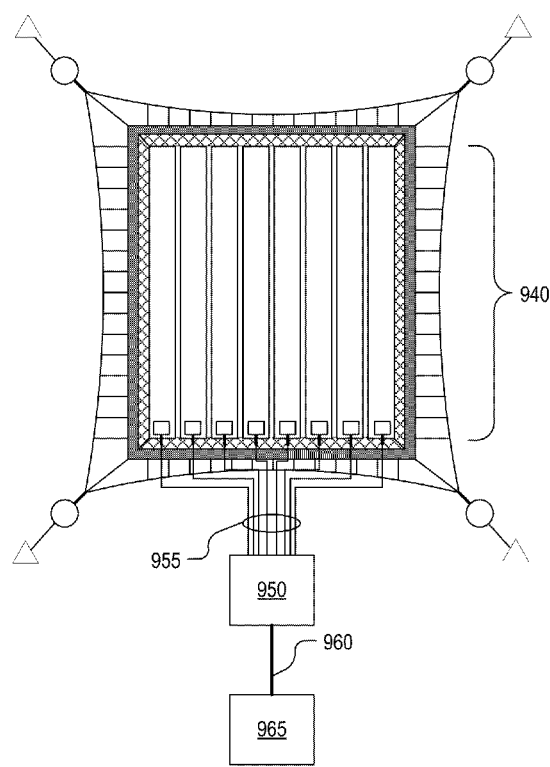

After mooring legs 910 are installed in the appropriate locations, two sections 915A and 915B of the tensioning frame are strung between a group of the mooring buoys. Referring to FIG. 9B, two sections 915A and 915B are attached between mooring buoys 920A, B, and C. In particular, sections 915A and 915B are adjoining sections that attach to a common mooring buoy 920B. Additionally, in process 820, edge protection members 925A and 925B (e.g, floating boom sections) are installed along respective sections 915A and 915B of the tensioning frame. Installation of edge protection members 925A and 925B includes attaching boom ties (e.g., boom ties 425; see FIG. 4) to the floating boom of edge protection members 925A and 925B. In one embodiment, each section 915 (e.g., including main line and boom ties) is pre-bundled with its corresponding edge protection member 925 such that the two components can be unrolled, or otherwise deployed, together as a single bundled unit. After the bundled unit is stretched out into its rough position between its corresponding mooring buoys 920, the strapping holding the two components together can be removed (e.g., cut away).

With two adjoining sections 915A and 915B of the tensioning frame installed, PV modules can be positioned for deployment (process block 825). In one embodiment, PV modules are wound on floating spools that are floated into position along section 915B of the tensioning frame. In other embodiments, PV modules are loaded onto floating platform 605 and deployed therefrom. Once in position, the first PV module 930 is unrolled from its position adjacent to section 915B and extended away from section 915B (see FIG. 9C). In one embodiment, a boat is used to both position the spools and to drag a PV module out into the water as it unrolls from its spool. In the illustrated embodiment, PV module 930 is unrolled along a path that is substantially parallel to section 915A of the tensioning frame. Once unrolled, PV module 930 is mechanically attached into position with the PV array. As the first PV module that is immediately adjacent to section 915A and edge protection member 925A, PV module 930 is mechanically bound into position via boom-to-array connector 935A along its long edge and to boom-to-array connector 935B along its short edge.

Process blocks 825 through 835 are sequentially repeated for each subsequent PV module until all PV modules are positioned, unrolled and mechanically bound to each other and to boom-to-array connector 935B (see FIG. 9D) to form a contiguous PV array 940 (decision block 840). In various embodiments, each PV module may include various edge treatments (e.g., snaps, buckles, zipper, hook and loop, etc.) for mechanically linking the long edges of adjoining PV modules. In the illustrated embodiments, only two adjoining sections 915A and 915B of the tensioning frame are initially deployed to allow a boat easy access into the workspace to both position the spools at their respective locations and drag the PV modules from their spools. In some embodiments, three sections 915A, 915B, and 915C of the tensioning frame may be deployed in process block 820 before the individual PV modules are unrolled into position. A three section initial deployment of the tensioning frame still enables access to the workspace. However, if all four sections of the tensioning frame are initially deployed, access to the water workspace is obstructed.

Figure 9G:
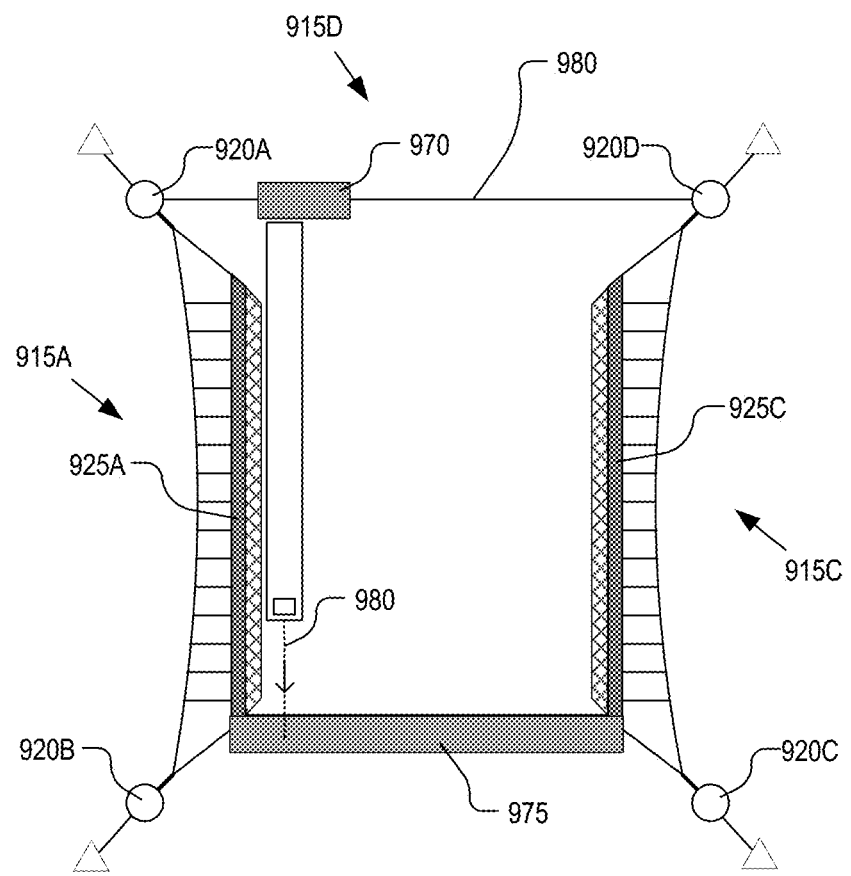

In yet other embodiments, the PV modules may be unrolled from a first floating platform and drawn along towards a second floating platform using cables. FIG. 9G illustrates this alternative embodiment using two floating platforms 970 and 975. In the illustrated embodiment, opposing sections 915A and 915C of the tensioning frame are initially installed between mooring buoys 920. In one embodiment, the initially deployed sections 915A and 915C do not share a common mooring leg. Optionally, section 915B (see FIG. 9B) may also be initially deployed along the side of floating platform 975. The PV modules are deployed from floating platform 970 and a cable used to draw each PV module toward floating platform 975. A field technician can stand on floating platform 975 and pull on cable 980 to causes the PV module to unroll from its material spool located on or adjacent to floating platform 970. Once a given PV module is in position and mechanically attached to the either section 915A or an adjacent already deployed PV module, floating platform 970 is moved laterally to the next position and the process repeats. In one embodiment, a guide cable 980 is extended between mooring buoys 920A and 920D. Guide cable 980 may be used to move floating platform 970 laterally to the next position. Once all of the PV modules are secured into a contiguous PV array, one or both of floating platforms 970 and 975 may be removed.

Returning to FIG. 8, in a process block 845, the remaining edge protection members (e.g., 925C and 925D) are attached to the exposed edges of PV array 940. Additionally, the remaining sections (e.g., 915C and 915D) of the tensioning frame are attached between a second group of the mooring buoys (e.g., mooring buoys 920A, D, and C). See FIG. 9E. With all mechanical members installed and interconnected, the tension on the tensioning frame is adjusted up to tension using the adjustable tensioning tethers 945 (process block 850).

With the mechanical members installed and tensioned, the electrical components are installed. In a process block 855, one or more waterproof enclosures 950 with integrated power combiners are electrically coupled to the PV modules of PV array 940 using a corresponding number of electrical interconnect assemblies 955. Although FIG. 9F only illustrates a single waterproof enclosure 950 and single electrical interconnect assembly 955, as discussed in connection with FIG. 3, multiple waterproof enclosures 950 each with a separate power combiner may each couple to a different sub-group of the PV modules. The electrical interconnect assemblies 955 may be implemented as waterproof wiring harnesses with wire leads have tailored lengths for connecting to their respective PV module.

In a process block 860, a single shore power cable 960 is run between waterproof enclosure 950 and shore substation 965. Will all electrical connections coupled, setup and diagnostic utilities can be run from shore substation 965 over a fiber optic cable embedded within shore power cable 960 to test the interconnections and operational health of each PV module.

Figure 10:
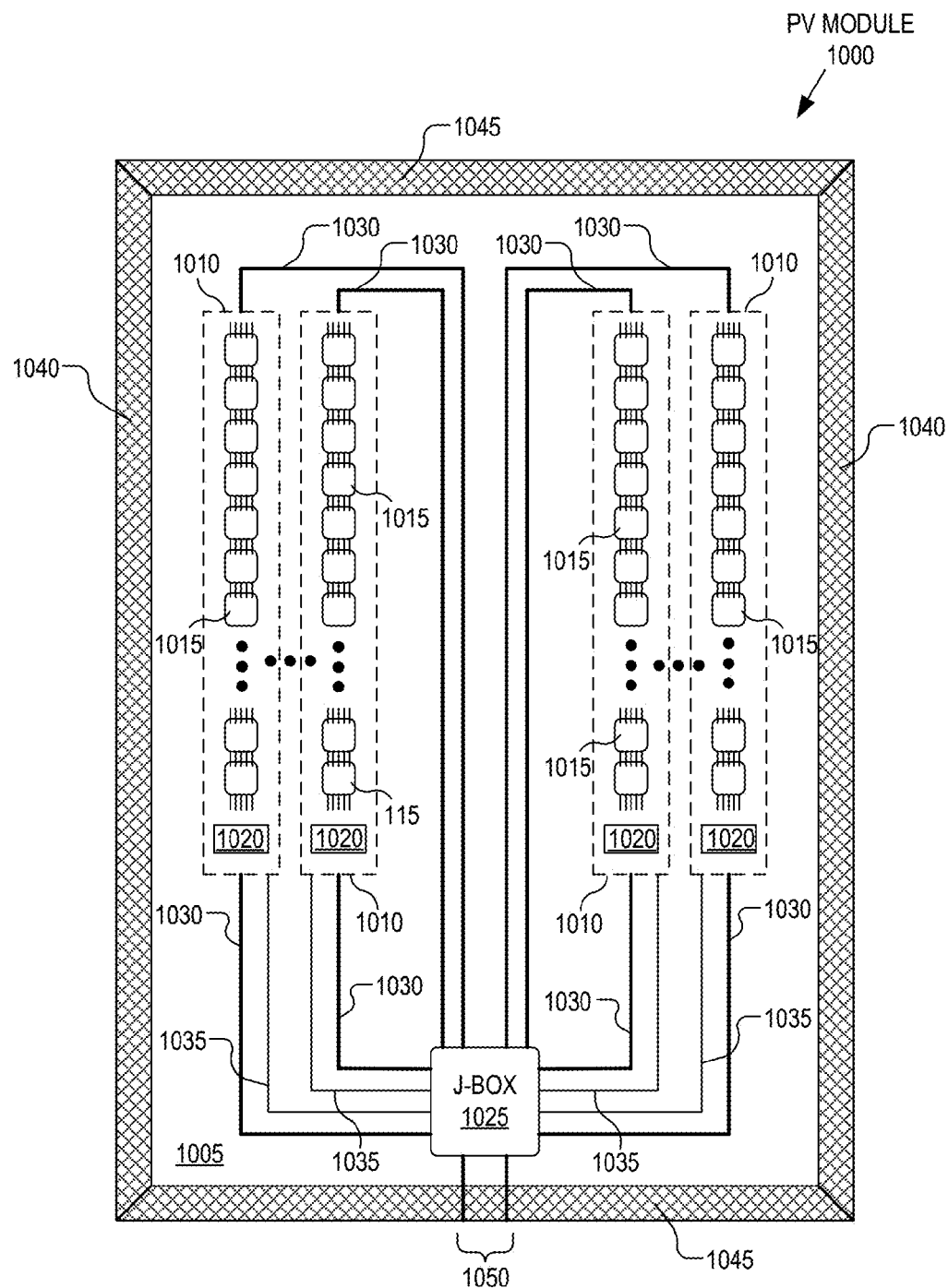
FIG. 10 is a functional block illustration of a demonstrative PV module, in accordance with an embodiment of the disclosure.

FIG. 10 is a functional block illustration of a demonstrative PV macro-module 1000, in accordance with an embodiment of the disclosure. PV macro-module 1000 is one possible implementation of PV modules 140 illustrated in FIG. 1. It should be appreciated that PV modules 140 may be implemented with a variety of other PV module structures as well. The illustrated embodiment of PV macro-module 1000 includes laminated support structure 1005, solar cell strings 1010 including solar cells 1015, distributed circuitry 1020, a junction box 1025, power lines 1030, signal lines 1035, edge connections 1040, end connections 1045, output ports 1050.

Solar cell strings 1010 each includes a plurality of solar cells 1015 electrically connected in series to generate solar power and a current in response to light incident upon a frontside of PV macro-module 1000. PV macro-module 1000 may include any number of solar cell strings 1010 each having any number of solar cells 1015. However, PV macro-module 1000 is well-suited for kilowatt power generation and may be coupled with additional instances of PV macro-module 1000 for mega-watt power generation. For example, each solar cell 1015 may be designed to output 10A @ 1V, each solar cell string 1010 may include between 50 and 1000 series connected solar cells 1015 to generate up to 10 A @ 1000V on output ports 1050. Of course, the actual number of solar cell strings 1010, number of solar cells 1015 per solar cell string 1010, amperage and voltage output may be selected by design and vary outside the above demonstrative ranges and/or that illustrated in FIG. 10. PV macro-module 1000 is referred to as a "macro" module to indicate that the design of PV macro-module 1000 is well-suited for integrating large numbers (e.g., 100's or 1000's) of solar cells 1015 into a single contiguous module or form factor for commercial grade power generation. However, it is also anticipated that the designs disclosed herein are also applicable to sub-kilowatt power generation applications.

In the illustrated embodiment, PV macro-module 1000 encases solar cell strings 1010 within laminated support structure 1005. Laminated support structure 1005 is fabricated as a multi-layer laminated structure that is durable, environmentally benign/inert, and relatively low cost when compared to conventional commercial grade solar power generating systems that include rigid housings and bulky support structures. Laminated support structure 1005 is a mat-like protective encasement that surrounds solar cell strings 1010 and is compliant to rolling or folding. By embedding solar cell strings 1010 in a laminated structure, expensive frames and mechanical support infrastructures can be avoided thereby facilitating simplified storage and quick deployment in a variety of environmental conditions. PV macro-module 1000 can be temporarily deployed for short-term power generation (e.g., portable deployments, deployments in the event of unexpected power grid failure, deployments in the event of natural disasters, etc.), seasonal power generation, or long-term/quasi-permanent deployments (e.g., multi-year or multi-decade).

In one embodiment, solar cells 1015 are fabricated of monocrystalline silicon; however, in other embodiments, solar cells 1015 may be implemented using polycrystalline silicon, thin film technologies, other semiconductor materials (e.g., gallium arsenide), or other solar cell technologies. The illustrated embodiment of each solar cell string 1010 includes a plurality of solar cells 1015 coupled in series. In other embodiments, solar cell strings 1010 may also include a group of parallel coupled solar cells 1010 that are coupled in series with other parallel coupled solar cells 1010. Furthermore, the physical layout of these series coupled solar cells 1015 may assume a variety of different patterns and routes. For example, a given solar cell string 1010 may follow a straight path, a zigzag or serpentine path, a curved path, a spiral path, or trace out any number of geometric patterns (e.g., concentric rectangles, etc.). In one embodiment, solar cells 1015 within a solar cell string 1010 are interconnected via embedded conductive interconnects that alternate physical connections on the frontside and backside of consecutive cells (e.g., see FIG. 13). Furthermore, solar cell strings 1010 may be interconnected to each other (series or parallel) via power lines 1030 also embedded within laminated support structure 1005.

In the illustrated embodiment, power lines 130 electrically connect solar cell strings 1010 to power circuitry within junction box 1025. Junction box 1025 includes the centralized circuitry for managing operations of solar cell strings 1010, collecting the solar power or current generated by solar cell strings 1010, and outputting the solar power via output ports. In the illustrated embodiment, junction box 1025 is a single enclosure that includes both power electronics, communication electronics, sensors, and control logic for PV macro-module 1000. In one embodiment, junction box 1025 is a hermetically sealed enclosure that dissipates heat to its surrounding environment. In other embodiments, junction box 1025 may represent multiple interconnected physical enclosures. Junction box 1025 may be integrated into laminated support structure 1005, mounted on a frontside, backside, or both sides of laminated support structure 1005. In one embodiment, a cutout or hole is made into laminated support structure 1005 into which junction box 1025 is disposed. In the illustrated embodiment, junction box 1025 is disposed proximate to one end of PV macro-module 1000, though it may also be mounted along a side edge or other interior location.

In addition to the centralized circuitry incorporated into junction box 1025, the illustrated embodiment of PV macro-module 1000 also includes distributed circuitry 1020 integrated within laminated support structure 1005 and disposed throughout PV macro-module 1000. Distributed circuitry 1020 is coupled to solar cell strings 1010 to selectively route current generated by solar cells 1015 under the influence and control of a controller within junction box 1025. Distributed circuitry 1020 may be coupled in various shunting paths across different portions of the various solar cell strings 1010 to bypass failing sections of solar cells 1010, to discharge and shutdown one or more solar cell strings 1010 (or portions thereof), to respond to a failure or short circuit condition sensed within PV macro-module 1000, or otherwise. In some embodiments, distributed circuitry 1020 includes switches, transistors, or fuses disposed in line with solar cells 1015, which can be selectively activated (e.g., energized, blown, etc) to open circuit or short circuit sections of solar cell strings 1010. For example, in one embodiment, a default state of PV macro-module 1000 may include shorting or clamping sections of solar cell strings 1010 to a safe voltage or even a ground state (note, in some embodiments, the ground state may be referenced to the water as opposed to a ground electrode). Signal lines 1035 are routed within laminated support structure 1005 to interconnect distributed circuitry 1020 to junction box 1025. Signal lines 1035 may be parallel or serial datapaths, and may include one or more addressing lines, command lines, and/or sensing lines.

Distributed circuitry 1020 also serves to increase yield rates for PV modules 1000. As mentioned above, PV module 1000 may include 100's or even 1000's of solar cells 1015. If every solar cell 1015 is required to function in order to obtain a functioning PV module 1000, the yield rate of PV macro-modules 100 could be unviable for mass production. Accordingly, distributed circuitry 1020 includes inline fuses and switches dispersed throughout solar cell strings 1010 to actively shunt or otherwise electrically disconnect non-functioning solar cells 1015, or sections of solar cells 1015, from the remaining functioning solar cells 1015. By sensing and actively isolating non-functioning solar cells 1015 from functioning solar cells 1015, yield rates for PV modules 1000 can be substantially increased. In one embodiment, distributed circuitry 1020 includes a pair of inline fuses surrounding a group of solar cells 1015 on either end and a shunting switch that bridges/shunts the group of solar cells 1015 surrounded by the inline fuses. These inline fuses can be selectively blown and the shunting switch affirmatively asserted to isolate the group of solar cells 1015 and route current around the isolated group. Of course, the pair of inline fuses and shunting switch structure may be repeated throughout PV module 1000 to selective isolate different sections as needed. Embodiments of distributed circuitry 1020 may include additional and/or alternative elements (e.g., bypass diodes).

PV macro-module 1000 may further include edge treatments for physically interconnecting and mounting one or more PV macro-modules 1000. For example, the illustrated embodiment of PV macro-module 1000 includes edge connections 1040 disposed along side edges of PV macro-module 1000 and end connections 1045 disposed along the shorter end edges of PV macro-module 1000. Edge connections 1040 represent edge treatments that facilitate mechanically connecting PV macro-module 1000 to other PV macro-modules 1000 when deployed in the field. Example edge connections 1040 may include zippers, snaps, hook and loop fasteners, tape, eyeholes for lacing, clips etc. Edge connections 1040 may further include various contours (e.g., scallops) or through holes to prevent pooling of rain or water and facilitate water drainage at the edges of a given PV macro-module 1000 even if positioned as an interior module of a large interconnected array of PV macro-modules 1000. Thus, edge connections 1040 facilitate quick deployment of large contiguous solar power systems of variable size and power ratings.

End connections 1045 represent end treatments that facilitate mechanical mounting or holding of PV macro-module 1000 taut when unfolded or unrolled. For example, end connections 1045 may include loops, periodic grommet holes, clips, zippers, tape, or other mounting locations for attaching various types of mounting tethers or tensioning systems to PV macro-module 1000 in a fully deployed orientation (e.g., unfolded, unrolled) while resisting environmental forces (e.g., wind, waves, etc.). Collectively, edge connections 1040 and end connections 1045 facilitate variable size deployments, that can be mechanically and electrically interconnected into a contiguous system. Although FIG. 1 illustrates side connections 1040 as residing along the longer edge of PV macro-module 1000 and end connections 1045 as residing along the shorter edge, these edge treatments may be swapped or even interspersed along a common edge/end.

Figure 11:
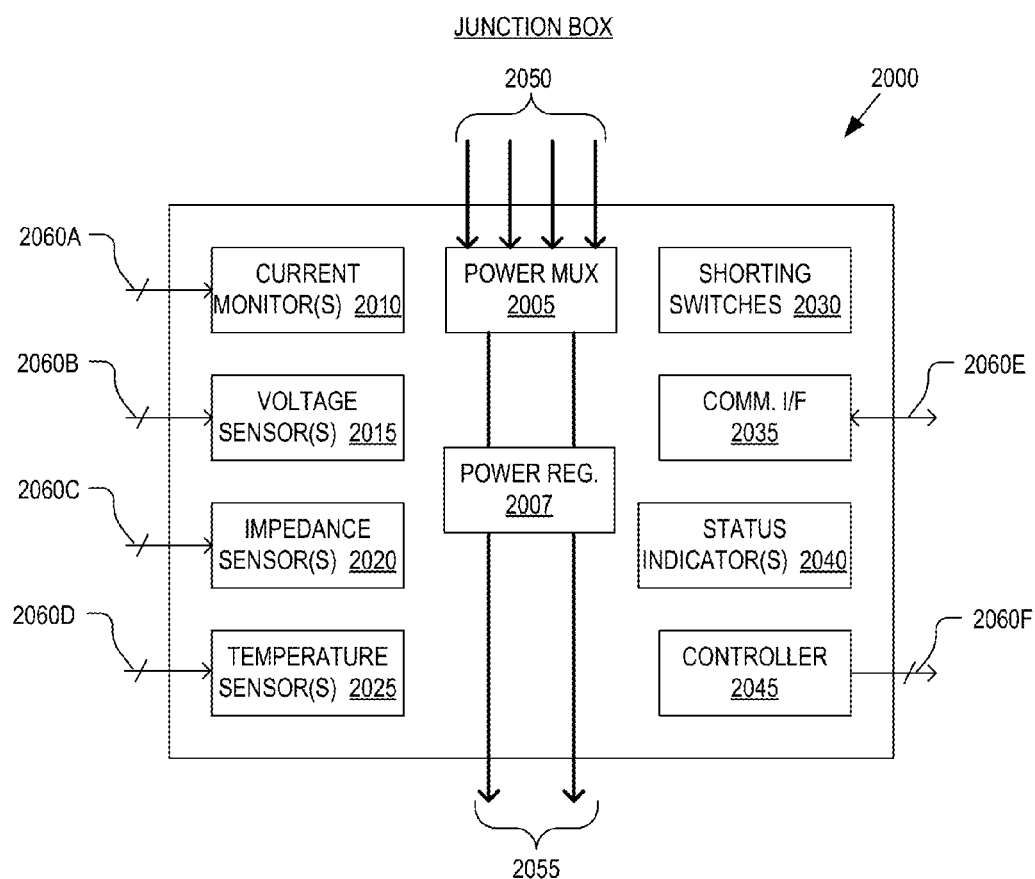
FIG. 11 is a functional block illustration of a junction box including centralized circuitry of a PV module, in accordance with an embodiment of the disclosure.

FIG. 11 is a functional block diagram of a junction box 2000 including centralized circuitry of a PV macro-module, in accordance with an embodiment of the disclosure. Junction box 2000 represents one possible implementation of junction box 1025 illustrated in FIG. 10. The illustrated embodiment, of FIG. 11 includes a power multiplexer 2005, a power regulator 2007, a current monitor(s) 2010, a voltage sensor(s) 2015, an impedance sensor(s) 2020, a temperature sensor(s) 2025, shorting switches 2030, a communication interface 2035, status indicators 2040, a controller 2045, power input ports 2050, power output ports 2055, and various signal/sense lines 2060A-F. In one embodiment, the functional units illustrated in FIG. 11 are all integrated into a single enclosure; however, in various other embodiments, junction box 2000 may represent multiple physical enclosures or devices that do not necessarily share a common physical box. Rather, these components are referred to as centralized circuitry to indicate that the functions they perform do not necessarily affect just a single solar cell string, but rather, have corporate responsibilities for overall management and function of PV macro-module 1000.

Power multiplexer 2005 is coupled via power lines 2050 to solar cell strings 1010 to receive and combine their output solar power and current. In one embodiment, power multiplexer 2005 couples solar strings 1010 in parallel; however, in other embodiments power multiplexer 2005 may couple solar cell strings 1010 in a variety of series or parallel combinations.

Power regulator 2007 is coupled to receive the solar generated power from solar cell strings 1010 and generate a regulated output voltage on output ports 2055. In the illustrated embodiment, power multiplexer 2005 is coupled between solar cell strings 1010 and power regulator 2007; however, in other embodiments, each solar cell string 1010 may be coupled to a dedicated power regulator within junction box 1025 and the output of these dedicated power regulators coupled together by a power multiplexer before being output on output ports 2055. In yet other embodiments, power multiplexer 2005 and power regulator 2007 may be functions that are integrated into a hybrid power block that provides both power multiplexing and power regulation. In one embodiment, power regulator 2007 is a DC-to-DC converter, which may incorporate a transformer, to step up or step down the voltage on output ports 2055 versus the voltage received on input power lines 2050. In other embodiments, power regulator 2007 performs maximum power point tracking for the entire PV macro-module 1000 or sub-sections thereof. In yet other embodiments, junction box 2000 may include a DC-AC inverter to convert the DC power received from solar cell strings 1010 to AC power for output on output ports 2055. In one embodiment, the power output on output ports 2055 is a three-phase AC power signal. These and other power regulation functions may be incorporated into power regulator 2007.

In one embodiment, controller 2045 is coupled to each of the other functional components within junction box 2050 to receive real-time feedback readings and orchestrate operations. Controller 2045 may be implemented as hardware logic (e.g., application specific integrated circuit, field programmable gate array, etc.), software or firmware instructions executing on a microcontroller, or a combination of both. Communication interface 2035 provides a communication link to controller 2045 for sending/receiving off-system messages. In one embodiment, controller 2045 and communication interface 2035 form components of an industrial control system, such as a supervisory control and data acquisition ("SCADA") system. Status indicators 2040 may include multi-color LED status lights, a display screen, or other visual/audible feedback indicators.

Current monitor 2010, voltage sensor 2015, impedance sensor 2020, and temperature sensor 2025 collectively represent sensor circuitry for supervising the safe operation of PV macro-module 1000. These systems provide real-time monitoring and fault detection (e.g., short circuit faults, overheat conditions, environmental intrusions causing solar cell failures, etc.). In one embodiment, each of these systems is coupled to various internal connection points both within laminated support structure 1005 via signal lines 2060 or to internal connection points within junction box 2000.

Shorting switches 2030 are power switches coupled across power lines 2050 at various locations to clamp the lines and electrically short or otherwise discharge the system. These shorting switches 2030 may be closed circuited in response to a shutdown signal from controller 2045 or even coupled to automatically close circuit if any of current monitor 2010, voltage sensor 2015, impedance sensor 2020, or temperature sensor 2025 register a relevant fault condition.

Figure 12A:
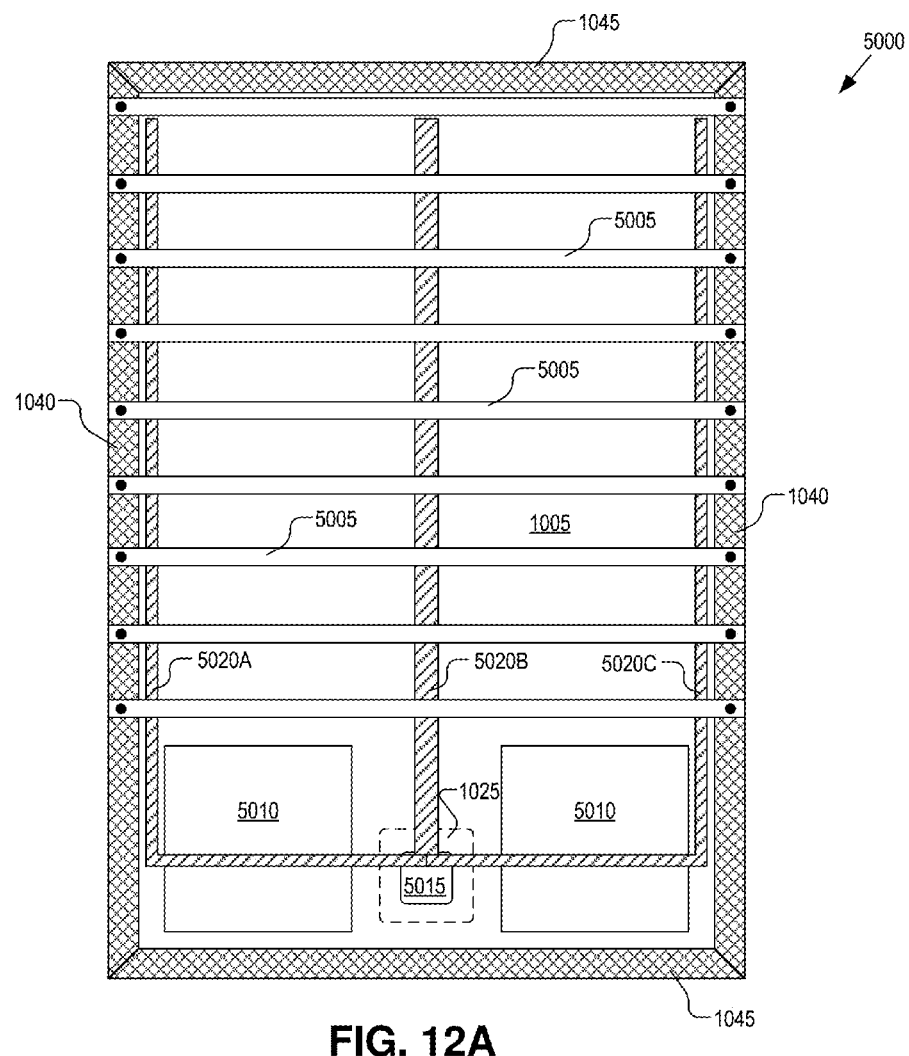
FIG. 12A is a backside illustration of a floating PV module, in accordance with an embodiment of the disclosure.
Figure 12B:
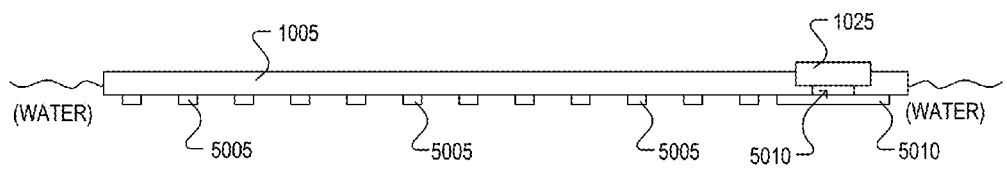
FIG. 12B is profile illustration of a floating PV module, in accordance with an embodiment of the disclosure.

FIG. 12A is a backside illustration of the addition of floating treatments to a PV macro-module 5000, in accordance with an embodiment of the disclosure. FIG. 12B is a profile illustration of the same. PV macro-module 5000 represents a floating implementation of PV macro-module 1000 illustrated in FIG. 10. The illustrated embodiment of the backside (or underside) of PV macro-module 5000 includes laminated support structure 1005, junction box 1025, edge connections 1040, end connections 1045, floatation pads 5005, floatation pads 5010, a cutout 5015, and external electrode 5020A-C.

In the illustrated embodiment, floatation pads 5005 are disposed in a pattern beneath solar cell strings 1010 to provide buoyancy to solar cell strings 1010, distributed circuitry 1020, and the bulk of laminated support structure 1005. FIG. 12A illustrates floatation pads 5005 disposed in a periodic pattern that covers less than 75% of the underside of laminated support structure 1005. 75% coverage or less with uniform deployment ensures even floatation support while also direct and substantially uniform exposure of water to the backside of laminated support structure 1005 for even cooling. It is anticipated that in alternative embodiments greater than 75% coverage may be feasible as well. Floatation pads 5005 can assume a variety of different shapes, cross-sections, and patterns and may be fabricated of a variety of low density materials such as polystyrene foam, hollow high-density polyethylene ("HDPE"), inflatable bladders, etc. In one embodiment, floatation pads 5005 are not disposed directly below a solar cell 1015, rather, are disposed in peripheral regions or in various patterns that do not place a floatation pad 5005 directly below a solar cell 1015. This indirect or peripheral placement reduces the concentration of mechanical stresses on solar cells 1015 thereby increasing the expected lifespan of solar cells 1015.

In the illustrated embodiment, floatation pads 5010 are disposed on the backside of laminated support structure adjacent to cutout 5015. Floatation pads 5010 provide increased buoyancy localized around junction box 1025 to carry its additional weight. Floatation pads 5010 may be fabricated of the same or different buoyant material as floatation pads 5005. Both floatation pads 5005 and floatation pads 5010 may be fixed to the underside of PV macro-module 5000 via mechanical fasteners (e.g., rivets, snaps, etc.), environmentally friendly adhesive, spot melting to form a bond, or otherwise. Junction box 1025 is disposed in and/or over cutout 5015 to expose at least a portion of a backside of junction box 1025 to the water below. Cutout 5015 is a hole through laminated support structure 1005 that provides good thermal contact between the water and junction box 1025 for efficient cooling. Although FIGS. 12A and 12B illustrate cutout 5015 as disposed in an interior portion of laminated support structure 1005 proximate to one end, in other embodiments, cutout 5015 may be disposed directly along an edge or end surface of PV macro-module 5000.

In one embodiment, PV macro-module 5000 also includes external electrode 5020 disposed along the backside of laminated support structure 1005. External electrode 5020 is externally exposed to provide direct electrical contact with the external environment. In the case of the floating PV macro-module 5000, this means external electrode 5020 provides electrical contact to the water body over which PV macro-module 5000 is floating. As illustrated, electrode 5020 is coupled to junction box 1025. In one embodiment, impedance sensor 2020 is coupled to external electrode 5020 to monitor the impedance between external electrode 5020 and one or more internal connection points for insulation fault conditions. To improve the electrical connection between external electrode 520 and the water, the illustrated embodiment of external electrode 520 includes three sections 520A, 520B, and 520C that run along the side edges and up the middle for most, if not all, of the length of PV macro-module 500.

Figure 13:
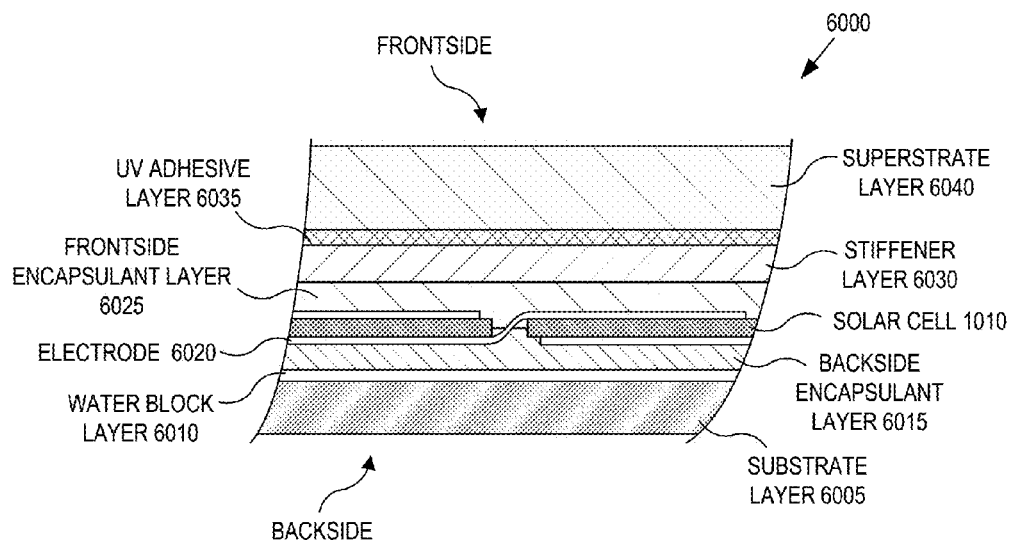
FIG. 13 is a cross-sectional material stack illustration of a demonstrative laminated support structure for a PV module, in accordance with an embodiment of the disclosure.

FIG. 13 is a cross-sectional illustration of a demonstrative material stack for implementing laminated support structure 1005, in accordance with an embodiment of the disclosure. FIG. 13 illustrates a material stack 6000 for laminated support structure 1005 that is compliant to being rolled for transport or storage of PV macro-module 1000. Material stack 6000 is also well suited for deployment in an aqueous environment, such as a water reservoir. The illustrated embodiment of material stack 6000 includes a substrate layer 6005, a water block layer 6010, a backside encapsulant layer 6015, a frontside encapsulant layer 6025, a stiffener layer 6030, an ultraviolet ("UV") blocking layer 6035, and a superstrate layer 6040.

Frontside encapsulant layer 6025 and backside encapsulant layer 6015 sandwich around solar cells 1010 which are electrically interconnected front to back and back to front by electrodes 6020. Both frontside and backside encapsulant layers 6025 and 6015 conform to and otherwise mold around solar cells 1010. In one embodiment, frontside and backside encapsulant layers 6025 and 6015 are formed of ethylene-vinyl acetate (EVA) each approximately 0.9 mm thick. In other embodiments, frontside and backside encapsulant layers 6025 and 6015 are fabricated from layers of polyolefin. In one embodiment, heat and pressure are used to encapsulate solar cells 1010 between the frontside and backside encapsulant layers. For example, even pressure may be applied using a vacuum tool, which also serves to eliminate deleterious moisture and air pockets.

Substrate layer 6005 provides physical environmental protection to the backside of solar cells 1010. In particular, substrate layer 6005 protects against damage occurring from physical impacts, animal influence, and other forms of physical intrusions from the backside. In one embodiment, substrate 6005 is fabricated of polyethylene terephthalate (PET) approximately 0.27 mm thick. In one embodiment, substrate layer 6005 is pigmented black in color.

Water block layer 6010 is an optional waterproofing layer that can extend the lifespan of solar cells 1010 when PV macro-module 1000 is deployed as a floating module. Water block layer 6010 may be fabricated of a metal foil layer, such as aluminum foil, an oxide layer, such as silicon dioxide, or otherwise.

Stiffener layer 6030 is a layer that adds stiffness to PV macro-module 1000 to reduce the incidence of fracture of solar cells 1010 when PV macro-module 1000 is rolled and further provides mechanical protection. Stiffener layer 6030 operates to limit the bend radius. In the illustrated embodiment, stiffener layer 6030 is disposed across the top side of solar cells 1010. Stiffener layer 6030 may be fabricated of a polymer material having the desired stiffness, such as a 0.27 mm thick layer of clear PPE.

In one embodiment, UV blocking layer 6035 is also an adhesive that is disposed between superstrate layer 6040 and stiffener layer 6030 to bond the two layers together. UV blocking layer 6035 includes UV filtering characteristics to block or otherwise reduce the amount of harmful UV light that penetrates to the lower layers. UV light can age or otherwise damage the underlying material layers thereby shorting the deployed lifespan of PV macro-module 1000. In one embodiment, UV blocking layer 6305 is a 0.2 mm thick layer of UV blocking EVA encapsulant.

Superstrate layer 6040 provides physical environmental protection to the frontside of solar cells 1010. In particular, superstrate layer 6040 protects against damage occurring from physical impacts, animal influence, and other forms of physical intrusions from the frontside. In one embodiment, superstrate layer 6040 is fabricated of a polymer material. For example, in one embodiment, superstrate layer 6040 is a 0.2 mm thick layer of a fluoropolymer such as ethylene tetrafluoroethylene (ETFE).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A method of deploying floating photovoltaic ("PV") modules on a waterbody, comprising:
    attaching first and second sections of a tensioning frame between a first group of mooring buoys in the waterbody, wherein the first and second sections are adjoining sections that attach to a common one of the mooring buoys;
    unrolling a plurality of PV modules from positions adjacent to the first section of the tensioning frame and extending the PV modules out from the first section;
    mechanically attaching the PV modules into a PV array that is contiguous;
    attaching third and fourth sections of the tensioning frame between a second group of the mooring buoys to at least partially surround the PV array with the tensioning frame; and
    adjusting tension on the tensioning frame to place the PV array under tension.

2. The method of claim 1, further comprising:
    floating the PV modules wound on floating spools into respective positions along the first section of the tensioning frame,
    wherein unrolling the PV modules comprises unrolling the PV modules from the floating spools while the floating spools are floating in the waterbody at the respective positions along the first section of the tensioning frame.

3. The method of claim 1, wherein extending the PV modules out from the first section comprises extending the PV modules out from the first section along paths substantially parallel to the second section of the tensioning frame.

4. The method of claim 1, further comprising:
    installing a plurality of mooring legs in the waterbody, wherein each of the mooring legs includes one of the mooring buoys tethered to an anchor secured to a bottom of the waterbody.

5. The method of claim 4, wherein each of the mooring legs further comprises an anchor tensioner assembly coupled to maintain tension on the PV array despite a limited drop in water elevation of the waterbody, the anchor tensioner assembly including:
    an anchor line coupled to one of the mooring buoys at a first end of the anchor line;
    a float coupled to the anchor line at a second end of the anchor line; and
    a pulley mounted to the anchor,
    wherein the anchor line passes through the pulley and a buoyancy of the float maintains tension on the anchor line as long as the float remains underwater.

6. The method of claim 1, further comprising:
    positioning first and second floating booms along the first and second sections of the tensioning frame, respectively, before unrolling the PV modules; and
    positioning third and fourth floating booms along the third and fourth sections of the tensioning frame after unrolling the PV modules,
    wherein the first, second, third, and fourth floating booms protect the PV array from floating debris in the waterbody.

7. The method of claim 6, further comprising:
    attaching boom ties extending from the tensioning frame to the first, second, third, and fourth floating booms; and
    attaching boom-to-array connectors extending from the first, second, third, and fourth floating booms to the PV array.

8. The method of claim 1, wherein mechanically attaching the PV modules to form the PV array that is contiguous comprises:
    sequentially attached adjoining sides of the PV modules to each other one at a time after each PV module is unrolled before unrolling a subsequent PV module.

9. The method of claim 1, further comprising:
    connecting a first wiring harness between a first group of the PV modules and a first power combiner disposed within a first waterproof enclosure;
    connecting the first power combiner to a shore substation via a first power cable; and
    positioning the first waterproof enclosure into the waterbody to provide heat dissipation from the first waterproof enclosure to the waterbody.

10. The method of claim 9, further comprising:
    connecting a second wiring harness between a second group of the PV modules and a second power combiner disposed within a second waterproof enclosure; and
    connecting the second power combiner to the first power combiner via a second power cable, wherein solar power generated via the second group of the PV modules is relayed to the shore substation over the first and second power cables.

11. The method of claim 9, further comprising:
    connecting a fiber optic cable between the shore substation and an optical fiber communication adapter disposed within the first waterproof enclosure,
    wherein data communications between the shore substation and the PV array use power line communication protocols over the first wiring harness between the PV array and the first waterproof enclosure and use optical communication protocols over the optical fiber cable between the first waterproof enclosure and the shore substation.

12. A method of deploying a floating photovoltaic ("PV") power generation system, comprising:

install a plurality of mooring legs in a waterbody, each of the mooring legs including an anchor;

attaching first and second sections of a tensioning frame between first selected ones of the mooring legs, wherein the first and second sections are adjoining sections that attach to a common one of the mooring legs;

unrolling a plurality of PV modules that generate solar power from spools positioned adjacent to the first section of the tensioning frame and extending the PV modules out from the first section;

mechanically attaching adjoining sides of the PV modules to each other to form a contiguous PV array;

attaching third and fourth sections of the tensioning frame between second selected ones of the mooring legs to surround the PV array with the tensioning frame; and adjusting tension on the tensioning frame to place the PV array under tension.

13. The method of claim 12, wherein the spools comprise floating spools, the method further comprising:

floating the floating spools with the PV modules wound thereon into respective positions along the first section of the tensioning frame, wherein unrolling the PV modules from the spools comprises unrolling the PV modules while the floating spools are floating in the waterbody at the respective positions along the first section of the tensioning frame.

14. The method of claim 12, wherein extending the PV modules out from the first section comprises extending the PV modules out from the first section along paths substantially parallel to the second section of the tensioning frame.

15. The method of claim 12, wherein the anchor is secured to a bottom of the waterbody, wherein each of the mooring legs further includes a mooring buoy tethered to the anchor and floating on or near a surface of the waterbody, wherein the tensioning frame connects to the mooring buoy of each of the mooring legs.

16. The method of claim 15, wherein each of the mooring legs further comprises an anchor tensioner assembly coupled to maintain tension on the PV array despite a limited drop in water elevation of the waterbody, the anchor tensioner assembly including:

an anchor line coupled to the mooring buoy at a first end of the anchor line;

a float coupled to the anchor line at a second end of the anchor line; and a pulley mounted to the anchor, wherein the anchor line passes through the pulley and a buoyancy of the float maintains tension on the anchor line as long as the float remains underwater.

17. The method of claim 12, further comprising:

positioning first and second floating booms along the first and second sections of the tensioning frame, respectively, before unrolling the PV modules; and positioning third and fourth floating booms along the third and fourth sections of the tensioning frame after unrolling the PV modules, wherein the first, second, third, and fourth floating booms protect the PV array from floating debris in the waterbody.

18. The method of claim 17, further comprising:

attaching boom ties extending from the tensioning frame to the first, second, third, and fourth floating booms; and attaching boom-to-array connectors extending from the first, second, third, and fourth floating booms to the PV modules.

19. The method of claim 12, wherein mechanically attaching the adjoining sides of the PV modules to each other to form the contiguous PV array comprises:

sequentially attached the PV modules one at a time after each PV module is unrolled before unrolling a subsequent PV module.

20. The method of claim 12, further comprising:

connecting a first wiring harness between a first group of the PV modules and a first power combiner disposed within a first waterproof enclosure;

connecting the first power combiner to a shore substation via a first power cable; and positioning the first waterproof enclosure into the waterbody to provide heat dissipation from the first waterproof enclosure to the waterbody.

21. The method of claim 20, further comprising:

connecting a second wiring harness between a second group of the PV modules and a second power combiner disposed within a second waterproof enclosure; and connecting the second power combiner to the first power combiner via a second power cable, wherein the solar power generated via the second group of the PV modules is relayed to the shore substation over the first and second power cables.

22. The method of claim 20, further comprising:

connecting a fiber optic cable between the shore substation and an optical fiber communication adapter disposed within the first waterproof enclosure, wherein data communications between the shore substation and the PV array use power line communication protocols over the first wiring harness between the PV array and the first waterproof enclosure and use optical communication protocols over the optical fiber cable between the first waterproof enclosure and the shore substation.

23. A method of deploying a floating photovoltaic ("PV") power generation system, comprising:

attaching first and second sections of a tensioning frame between mooring legs anchored within a waterbody, wherein the first and second sections are opposing sections that do not share a common one of the mooring legs;

deploying the plurality of PV modules from material spools into a space between the first and second sections of the tensioning frame;

mechanically attaching adjoining sides of the PV modules to each other to form a PV array that is contiguous;

attaching the PV array to the first and second sections of the tensioning frame; and adjusting tension on the tensioning frame to place the PV array under tension.

24. The method of claim 23, wherein drawing the PV modules from the material spools into the space between the first and second sections of the tensioning frame comprises:

sequentially drawing the PV modules between first and second floating platforms, wherein the material spools are disposed on or adjacent to the first floating platform and the PV modules are drawn towards the second floating platform using a cable.

25. The method of claim 24, wherein the first floating platform is moored between two of the mooring legs by at least a guide cable, the method further comprising:

repositioning the first floating platform along the guide cable between deploying each of the PV modules from the material spools.

* * * * *